United States Patent
Iwamoto et al.

(10) Patent No.: US 9,570,030 B2
(45) Date of Patent: Feb. 14, 2017

(54) DISPLAY DEVICE AND METHOD OF DRIVING THE SAME

(71) Applicant: Sharp Kabushiki Kaisha, Osaka-shi, Osaka (JP)

(72) Inventors: Akihisa Iwamoto, Osaka (JP); Masami Ozaki, Osaka (JP); Tomohiko Nishimura, Osaka (JP); Kohji Saitoh, Osaka (JP); Masaki Uehata, Osaka (JP); Jun Nakata, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 2 days.

(21) Appl. No.: 14/435,783

(22) PCT Filed: Oct. 11, 2013

(86) PCT No.: PCT/JP2013/077717
§ 371 (c)(1),
(2) Date: Apr. 15, 2015

(87) PCT Pub. No.: WO2014/061574
PCT Pub. Date: Apr. 24, 2014

(65) Prior Publication Data
US 2015/0269900 A1  Sep. 24, 2015

(30) Foreign Application Priority Data

Oct. 19, 2012  (JP) .................................. 2012-231995

(51) Int. Cl.
*G09G 3/36* (2006.01)
*G11C 19/28* (2006.01)

(52) U.S. Cl.
CPC .......... *G09G 3/3688* (2013.01); *G09G 3/3648* (2013.01); *G09G 3/3677* (2013.01);
(Continued)

(58) Field of Classification Search
CPC  G09G 2330/027; G09G 3/2092; G09G 5/003; G09G 3/3696; G09G 2330/04; G09G 2330/02; G09G 2310/0245; G09G 2320/0223; G09G 2300/0861; G09G 2310/0286; G09G 2310/0297; G09G 3/3266; G09G 3/3674; G11C 19/28
See application file for complete search history.

(56) References Cited

U.S. PATENT DOCUMENTS

2007/0229433 A1* 10/2007 Jang ..................... G09G 3/3677
345/96
2008/0165099 A1*  7/2008 Cho ..................... G09G 3/3406
345/87
(Continued)

FOREIGN PATENT DOCUMENTS

WO  2010/050262 A1  5/2010
WO  2011/055584 A1  5/2011

OTHER PUBLICATIONS

Iwamoto; "Liquid Crystal Display Device and Drive Method for Same"; U.S. Appl. No. 14/364,090, filed Jun. 10, 2014.

*Primary Examiner* — Sanjiv D Patel
(74) *Attorney, Agent, or Firm* — Keating & Bennett, LLP

(57) ABSTRACT

A gate driver (24) which is provided by an IGZO-GDM and a level shifter circuit (13) are connected to each other via a first through a fifth wires (OL1 through OL5). Each wire (OL) is connected to a discharge unit (190). If an electric power supply to a first through a fifth output circuits (OC1 through OC5) in the level shifter circuit (13) becomes lower than a lower operation limit value during a power-off sequence which is supposed to remove a residual charge from inside a panel, outputs from the first through the fifth output circuits (OC1 through OC5) assume a high-impedance state, whereupon a potential on each wire (OL) is drawn by a discharge unit (190) into a ground potential.

(Continued)

Therefore, residual charge inside the panel is removed quickly and stably when power supply is shut off.

14 Claims, 15 Drawing Sheets

(52) U.S. Cl.
CPC ... *G09G 3/3696* (2013.01); *G09G 2300/0819* (2013.01); *G09G 2300/0876* (2013.01); *G09G 2310/0251* (2013.01); *G09G 2310/0286* (2013.01); *G09G 2330/02* (2013.01); *G09G 2330/021* (2013.01); *G09G 2330/027* (2013.01); *G11C 19/28* (2013.01)

(56) References Cited

U.S. PATENT DOCUMENTS

| | | | |
|---|---|---|---|
| 2009/0009503 A1* | 1/2009 | Tajiri | G09G 3/3655 345/211 |
| 2011/0134090 A1 | 6/2011 | Iwamoto et al. | |
| 2011/0234565 A1* | 9/2011 | Morii | G09G 3/3677 345/211 |
| 2012/0218245 A1* | 8/2012 | Morii | G09G 3/3677 345/211 |
| 2012/0249502 A1* | 10/2012 | Takahashi | G09G 3/3677 345/205 |
| 2013/0173870 A1* | 7/2013 | Tseng | G09G 3/3677 711/154 |
| 2013/0328847 A1* | 12/2013 | Al-Dahle | G09G 5/003 345/211 |

* cited by examiner

FIG.13

|  | NORMAL OPERATION (~t0) | INITIALIZATION STEP (t1~t2) | FIRST DISCHARGE STEP (t2~t3) | SECOND DISCHARGE STEP (t3~t4) |
|---|---|---|---|---|
| H_GSP | VGH1, VGL | VGL | VGH1 | VGH1 (GND) |
| H_GCK | VGH1, VGL | VGL | VGH1 | VGH1 (GND) |
| H_CLR | VGH2, VGL | VGH2 | VGH2 | VGH2 |
| H_VSS | VGL | VGL | VGH1 | VGH1 (GND) |

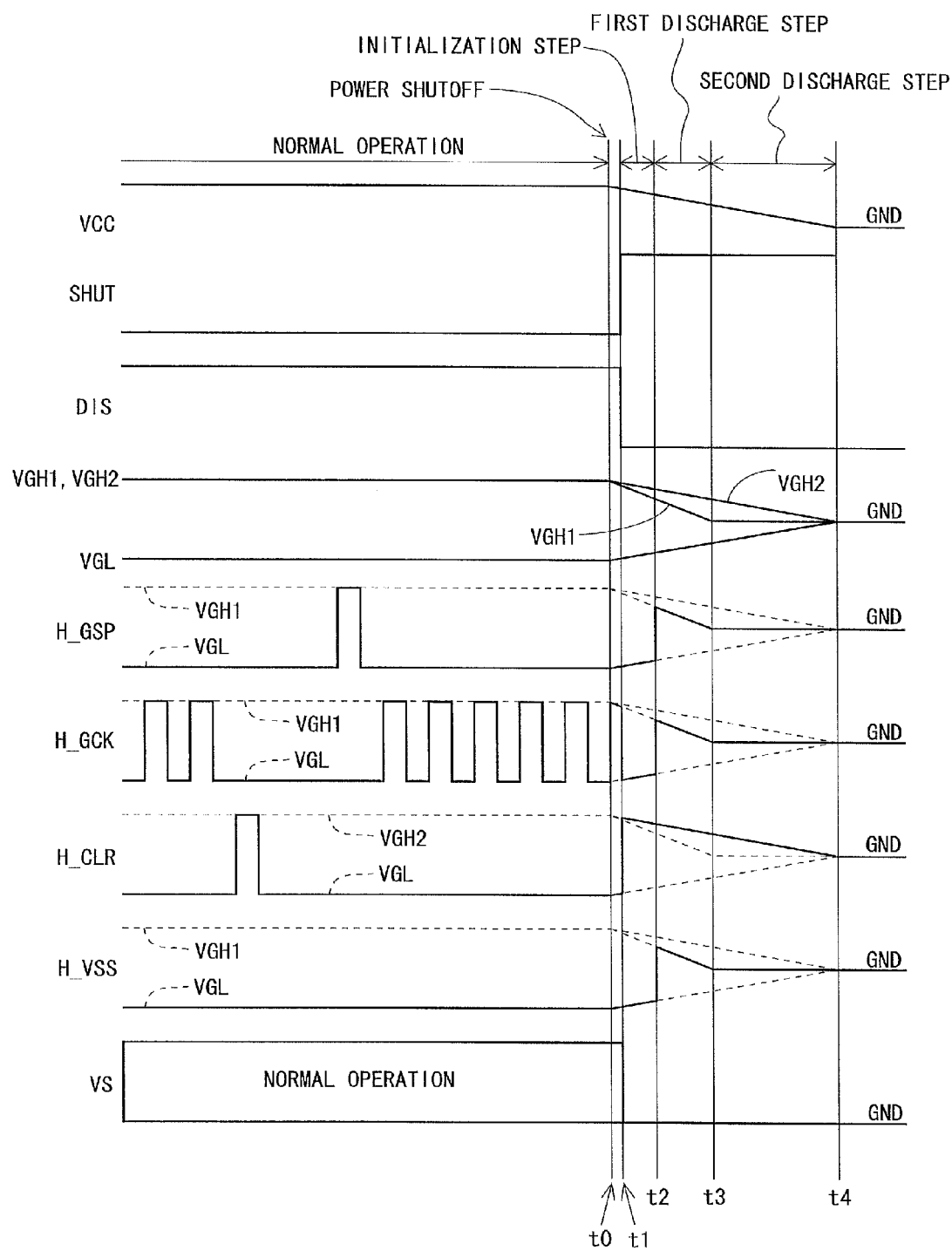

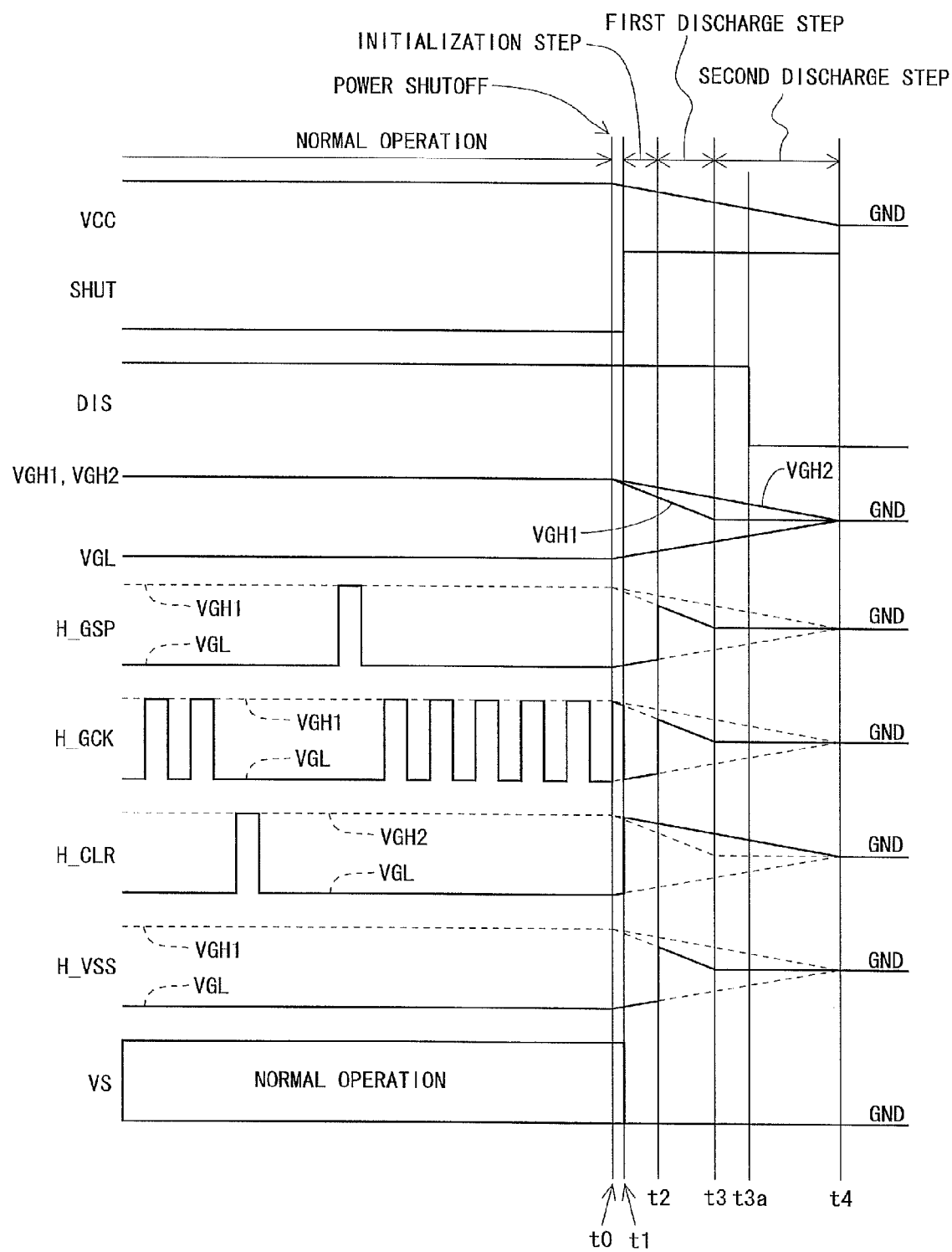

DISPLAY DEVICE AND METHOD OF DRIVING THE SAME

TECHNICAL FIELD

The present invention relates to display devices and methods of driving the same.

BACKGROUND ART

Typically, an active-matrix liquid crystal display device includes a liquid crystal panel constituted by a liquid crystal layer and two substrates which sandwich the liquid crystal layer. One of these two substrates is formed with a plurality of scanning lines, a plurality of data lines, and a plurality of pixel formation portions arranged in a matrix pattern, with each portion formed correspondingly to one of intersections made by the these scanning lines and the data lines. Each pixel formation portion includes such components as: a thin film transistor (TFT) which has its gate terminal connected to one of the scanning lines that passes a corresponding one of the intersections, and its source terminal connected to one of data lines that passes that intersection; and a pixel capacitance for writing a data signal sent via the data line. The other of the two substrates may be formed with a common electrode which is common to the pixel formation portions. The active-matrix liquid crystal display device further includes: a gate driver (scanning line drive circuit) which drives the scanning lines; and a source driver (data line drive circuit) which drives the data lines.

Although the data signal is sent via the data lines as described above, each data line cannot deliver data signals for a plurality of rows at one time (simultaneously). Therefore, writing of data signals to the pixel capacitances in the pixel formation portions is performed sequentially, row by row, for example. Accordingly, for the purpose of selecting the plurality of scanning lines sequentially for a predetermined period, the gate driver is constituted by a shift register which has a plurality of stages.

Liquid crystal display devices which have such an arrangement as described above may have a problem that even if the user has shut off power supply, the display is not cleared immediately, with an image persisting like a residual image. This happens because, once the power supply to the device is turned off, a discharge path for an electric charge stored in the pixel capacitance is shut off and a residual charge stays in the pixel formation portion. If power supply to the device is turned on while there is a residual charge stored in the pixel formation portion, the residual charge may lower display quality with flickers for example, by causing uneven distribution of impurities. In order to eliminate these problems, conventional solutions include, for example, that all scanning lines are selected at the time when the power is turned off, and a black voltage is applied to all data lines, to allow electric charges on the panel to discharge.

Conventionally, the gate driver is usually mounted at a peripheral region of the liquid crystal panel substrate as an integrated circuit (IC) chip. Increasingly however, the gate driver is formed directly on the substrate, in recent years. Such a gate driver is called "monolithic gate driver". Also, a panel which includes a monolithic gate driver is called "gate driver monolithic panel".

In the gate driver monolithic panel, it is impossible to employ the above-described method in regard to releasing the charge from the panel. To this problem, International Laid-Open No. 2011/055584 pamphlet (WO 2011/055584) discloses a liquid crystal display device as follows. In a bistable circuit which constitute a shift register in the gate driver, there is provided a TFT which has: its gate terminal supplied with a clock signal to activate the shift registers; its source terminal connected to a reference potential wiring through which a reference potential is transmitted; and its drain terminal connected to the scanning line. In the arrangement described above, external power supply is shut off, upon which the clock signal is turned to HIGH level to turn ON the TFT, whereas the reference potential is raised from a gate-off potential to a gate-on potential. This increases each scanning line potential to the gate-on potential, whereby the residual charge is discharged in all of the pixel formation portions. Also, International Laid-Open 2010/050262 pamphlet (WO 2010/050262) discloses a technique for eliminating a malfunction caused by a leak from a TFT, as an invention regarding the gate driver monolithic panel.

REFERENCE LIST

Patent Literature

Patent Literature 1: WO 2011/055584
Patent Literature 2: WO 2010/050262

SUMMARY OF THE INVENTION

Problems to be Solved by the Invention

In recent years, development is underway for liquid crystal panels which employ a TFT that has its channel layer formed of a specific type of oxide semiconductor, namely, indium gallium zinc oxide (hereinafter such a TFT will be called "IGZO-TFT"). Hereinafter, a liquid crystal panel which utilizes an IGZO-TFT will be called "IGZO-TFT liquid crystal panel". In the field of IGZO-TFT liquid crystal panel, development for monolithic gate drivers is underway. Hereinafter, a monolithic gate driver mounted in a IGZO-TFT liquid crystal panel will be called "IGZO-GDM".

Conventional TFTs used in liquid crystal panels have their channel layers formed of an amorphous silicon (hereinafter such a TFT will be called "a-Si TFT"), and these TFTs do not have good turn-off characteristics. So, in a liquid crystal panel which utilizes an a-Si TFT (hereinafter called "a-Si TFT liquid crystal panel"), electric charges on floating nodes other than in the pixel formation portions (hereinafter may be called "floating charge") are discharged within a few seconds. Therefore, floating charge other than in the pixel formation portion is not a problem in a-Si TFT liquid crystal panels. IGZO-TFTs, however, are superior not only in turn-on characteristics but also in turn-off characteristics. They are remarkably superior to a-Si TFTs in their turn-off characteristics when a gate bias voltage is 0 V (no bias); in other words, a floating charge on a node which is connected to an IGZO-TFT is not discharged via the TFT during gate-off. As a result, the charge remains for a long time in the circuit. According to a certain calculation, an IGZO-GDM which has a configuration as shown in FIG. 10 and will be described later will require a few hours (a few thousands of seconds through a few tens of thousands of seconds) for a floating charge on netA to discharge. Also, according to a bias temperature stress test of IGZO-GDMs, IGZO-TFTs have a threshold shift which can be as large as a few volts in an hour. From these findings, it is understood that the residual charge in the IGZO-GDM is a major factor of the threshold shift in the IGZO-TFT. This indicates that if a shift register in an IGZO-GDM halts during operation, a TFT threshold shift can occur only in one stage. A result is that the shift registers no longer operate properly, and image display in the screen will cease.

As another problem, if the gate driver is provided by an IC chip, all TFTs in the panel are those in the pixel formation portion. Therefore, when power supply is turned off, discharging the charge in the pixel formation portion and the charge on the scanning lines is enough. However, in the case of a monolithic gate driver, there is another group of TFTs in the panel, i.e., TFTs in the gate driver. In such a configuration, as shown in FIG. 10 for example, there are two floating nodes, one indicated by a reference symbol netA and the other indicated by a reference symbol netB (hereinafter, respectively called "first node" and "second node"). This means that it is necessary in the IGZO-GDM, to discharge a charge in the pixel formation portion, a charge in the scanning line, a charge in the first node netA, and a charge in the second node netB, when power supply is turned off. Further, these charges should desirably be discharged stably.

It is therefore an object of the present invention to provide a display device which is capable of quickly and stably remove residual charge in the panel when power supply is shut off; i.e., a display device suitable for employing a monolithic gate driver that makes use of, e.g., a TFT having its channel layer formed of an oxide semiconductor. It is also an object of the invention to provide a driving method of the display device.

Solutions to the Problem

A first aspect of the present invention provides a display device which includes:

a display panel including a plurality of data lines for delivery of data signals, a plurality of scanning lines, a plurality of pixel formation portions corresponding to the plurality of data lines and the plurality of scanning lines, and a scanning line drive circuit configured to selectively drive the plurality of scanning lines;

a drive controller configured to control the scanning line drive circuit;

a power supply circuit configured to generate and supply to the drive controller, a scanning line selection potential for bringing the scanning lines into a selected state and a scanning line de-selection potential for bringing the scanning lines into a de-selected state, based on an external electric power supply;

a plurality of wires for connecting the scanning line drive circuit and the drive controller to each other;

a discharge unit having one terminal connected to the wire, and another terminal grounded; and a power supply state detection unit configured to supply a predetermined power-off signal to the drive controller upon detection of an OFF state of the power supply; in this display device. In this arrangement, the scanning line drive circuit includes a shift register which has a plurality of bistable circuits corresponding to the scanning lines and sequentially outputs a pulse based on a clock signal, the power supply circuit generates, as the scanning line selection potential, a first scanning line selection potential and a second scanning line selection potential, the second scanning line selection potential being slower in its level change than the first scanning line selection potential when the power supply is brought to an OFF state, the drive controller supplies the scanning line drive circuit with the clock signal, a clear signal for initializing a state of the bistable circuits, and a reference potential as a baseline for operation of the bistable circuits, respectively via the wires, and sequentially performs, upon reception of the power-off signal, a first discharge process of setting a potential of the clock signal and the reference potential to the first scanning line selection potential, and a second discharge process of setting a potential of the clear signal to the second scanning line selection potential. Further, the bistable circuit includes:

an output node connected to a corresponding one of the scanning lines;

an output control switching element having its first conduction terminal supplied with the clock signal, and its second conduction terminal connected to the output node;

a first node connected to a control terminal of the output control switching element; and a first first-node control switching element having its control terminal supplied with the clear signal, its first conduction terminal connected to the first node, and its second conduction terminal supplied with the reference potential.

A second aspect of the present invention provides the first aspect of the present invention, wherein the discharge unit includes a discharge resistor.

A third aspect of the present invention provides the second aspect of the present invention, wherein the discharge unit further includes a control switch which is in series with the discharge resistor and closes when the power supply is in the OFF state.

A fourth aspect of the present invention provides the second aspect of the present invention, wherein the discharge unit further includes a control switch which is in series with the discharge resistor and closes when the second scanning line selection potential becomes lower than a predetermined value.

A fifth aspect of the present invention provides the first aspect of the present invention, wherein the drive controller includes a plurality of output circuits configured to operate on the second scanning line selection potential as a power supply and to respectively output the clock signal, the clear signal, and the reference potential.

A sixth aspect of the present invention provides the first aspect of the present invention, wherein the bistable circuit further includes:

a second first-node control switching element having its first conduction terminal connected to the first node, and its second conduction terminal supplied with the reference potential;

a second node connected to a control terminal of the second first-node control switching element; and a second node control switching element having its control terminal supplied with the clear signal; its first conduction terminal connected to the second node; and its second conduction terminal supplied with the reference potential.

A seventh aspect of the present invention provides the first aspect of the present invention, wherein the bistable circuit further includes an output node control switching element having its control terminal supplied with the clock signal, its first conduction terminal connected to the output node, and its second conduction terminal supplied with the reference potential.

An eighth aspect of the present invention provides the first aspect of the present invention, wherein the power supply circuit changes, when the power supply is brought to an OFF state, the first scanning line selection potential from a level at a time point when the power supply is brought to the OFF state, to a ground level over a predetermined period of time.

A ninth aspect of the present invention provides the eighth aspect of the present invention, wherein the power supply circuit includes:

a first scanning line selection potential generation wire connected to at least a first capacitance and a first resistor, for generation of the first scanning line selection potential based on a predetermined potential obtained from the power supply; and a second scanning line selection potential generation wire connected to at least a second capacitance and a second resistor, for generation of the second scanning line selection potential based on a predetermined potential obtained from the power supply. In this arrangement, the second capacitance and the second resistor provide a time constant which is larger than a time constant provided by the first capacitance and the first resistor.

A tenth aspect of the present invention provides the first aspect of the present invention, wherein the drive controller performs an initialization process of setting a potential of the clear signal to the second scanning line selection potential and the reference potential to the scanning line de-selection potential, prior to the first discharge process upon reception of the power-off signal.

An eleventh aspect of the present invention provides the tenth aspect of the present invention, wherein the drive controller sets a potential of the clock signal to the scanning line de-selection potential in the initialization process.

A twelfth aspect of the present invention provides the first aspect of the present invention, wherein the switching elements included in the bistable circuit are each provided by a thin film transistor having its channel layer formed of an oxide semiconductor.

A thirteenth aspect of the present invention provides the twelfth aspect of the present invention wherein the oxide semiconductor is provided by an indium gallium zinc oxide.

A fourteenth aspect of the present invention provides a driving method for a display device including a display panel including a plurality of data lines for delivery of data signals, a plurality of scanning lines, a plurality of pixel formation portions corresponding to the plurality of data lines and the plurality of scanning lines, and a scanning line drive circuit configured to selectively drive the plurality of scanning lines; a drive controller configured to control the scanning line drive circuit; a power supply circuit configured to generate and supply to the drive controller, a scanning line selection potential for bringing the scanning lines into a selected state and a scanning line de-selection potential for bringing the scanning lines into a de-selected state, based on an external electric power supply; and a plurality of wires for connecting the scanning line drive circuit and the drive controller to each other;

the driving method includes:

a power supply state detection step of detecting an ON/OFF state of the electric power supply;

an in-panel discharge step of releasing a charge from inside the display panel upon detection of the OFF state in the power supply state detection step; and a wire discharge step of releasing a charge stored in the ware, using at least part of a period in which the electric power supply is in the OFF state. In this arrangement, the scanning line drive circuit includes a shift register having a plurality of bistable circuits corresponding to the scanning lines and configured to sequentially output a pulse based on a clock signal; and the power supply circuit generates, as the scanning line selection potential, a first scanning line selection potential and a second scanning line selection potential, the second scanning line selection potential being slower in its level change than the first scanning line selection potential when the power supply is brought to an OFF state. In the present method, the in-panel discharge step includes:

an output step of supplying the scanning line drive circuit with the clock signal, a clear signal for state initialization of the bistable circuits, and a reference potential as an operation baseline for the bistable circuits, via the wires;

a first discharge step of setting a potential of the clock signal and the reference potential to the first scanning line selection potential; and a second discharge process of setting a potential of the clear signal to the second scanning line selection potential. Further, the bistable circuit includes:

an output node connected to a corresponding one of the scanning lines;

an output control switching element having its first conduction terminal supplied with the clock signal, and its second conduction terminal connected to the output node;

a first node connected to a control terminal of the output control switching element; and a first first-node control switching element having its control terminal supplied with the clear signal, its first conduction terminal connected to the first node, and its second conduction terminal supplied with the reference potential.

Advantages of the Invention

According to the first aspect of the present invention, when electric power supply is shut off in a display device, two processes (the first discharge process and the second discharge process) are performed sequentially for releasing charges from inside the display panel. In the first discharge process, the clock signal potential and the reference potential are set to the first scanning line selection potential. The clock signal potential, which now has the first scanning line selection potential, is supplied to the output node via the output control switching element, bringing each scanning line into selected state. The data signal potential is set to a grounding potential, so a charge in each pixel formation portion is discharged. Also, when power supply is shut off, the first scanning line selection potential changes its level more quickly than the second scanning line selection potential. Therefore, charges on the scanning lines are also discharged in the first discharge process. In the second discharge process, the clear signal potential is set to the second scanning line selection potential. The second scanning line selection potential changes its level more slowly than the first scanning line selection potential when power supply is shut off. Therefore, upon starting the second discharge process, the second scanning line selection potential is kept at a level capable of turning ON the switching element which is included in each bistable circuit. Therefore, charges on the floating nodes in each bistable circuit are discharged in the second discharge process. In addition to the above, each wire which connects the scanning line drive circuit to the drive controller is connected to a discharge unit. Therefore, even if the scanning line selection potential which is supplied to the drive controller becomes lower than a value required for activating the drive controller, thereby causing each output terminal (which is connected to said wire) in the drive controller to come into a high-impedance state, the wire is not brought into a floated state (potential is drawn into the ground potential). Following through the process described above, it is possible to remove residual charge from inside the panel quickly and stably when power supply is shut off.

According to the second aspect of the present invention, the same advantages as offered by the first aspect of the present invention are offered by utilizing a discharge resistor.

According to the third aspect of the present invention, the control switch is open at any time other than when power supply is shut off (hereinafter may called "during normal operation"). Therefore, there is no electric current flowing through the discharge resistor. Thus, it is possible to suppress increase in power consumption caused by the discharge resistor during normal operation.

According to the fourth aspect of the present invention, the control switch is open during normal operation like in the third aspect of the present invention, so there is no electric current flowing through the discharge resistor. Thus, it is possible to suppress increase in power consumption caused by the discharge resistor during normal operation. Also, the control switch is open even at the time of power shutoff until the second scanning line selection potential comes lower than a predetermined value (i.e., a value required for activating the drive controller), so there is no electric current flowing through the discharge resistor. This stabilizes output waveforms from the drive controller until the second scanning line selection potential comes lower than the predetermined value, and therefore makes it possible to remove residual charge from inside the panel even more stably when power is shut off. Also, the fourth aspect provides greater suppression than the third aspect on power consumption increase caused by the discharge resistor at the time of power shut down.

According to the fifth aspect of the present invention, the wire is not brought to a floating state (since its potential is drawn into the ground potential) even if the second scanning line selection potential becomes lower than a lower operation limit value of the output circuit and the output from the output circuit assumes a high-impedance state. Therefore, it is possible to provide the same advantages as offered by the first aspect of the present invention.

According to the sixth aspect of the present invention, it becomes possible to draw the potential of the first node into the reference potential at any time in normal operation. Therefore, it is possible to suppress malfunctions.

According to the seventh aspect of the present invention, when the reference potential assumes the first scanning line selection potential in the first discharge process, the output node control switching element turns ON. This makes it possible to reliably bring each scanning line into selected state thereby allowing a charge in each pixel formation portion to be discharged in the first discharge process.

According to the eighth aspect of the present invention, the potential at the output node gradually decreases in the first discharge process. This decreases influence of a kickback voltage on each pixel, i.e., influence on display.

According to the ninth aspect of the present invention, it is possible to generate two kinds of scanning line selection potentials which are different from each other in their state of level change when the power supply is shut off, with a relatively simple configuration.

According to the tenth aspect of the present invention, each bistable circuit in the shift register is initialized prior to the first discharge process. This removes residual charges from inside the display panel more reliably when the power supply is shut off, making it possible to effectively suppressing malfunctions caused by residual charges inside the display panel.

According to the eleventh aspect of the present invention, each bistable circuit in the shift register is initialized more reliably during the initialization process.

According to the twelfth aspect of the present invention, the same advantages as offered by the first aspect of the present invention are provided in a display device which includes a scanning line drive circuit having a TFT (hereinafter called "oxide TFT") that has its channel layer formed of an oxide semiconductor. Conventional liquid crystal display devices which include a scanning line drive circuit that have an oxide TFT are susceptible to malfunctions caused by residual charges in the display panel. According to the twelfth aspect of the present invention, these devices can enjoy the advantages of suppressing malfunctions which can be caused by residual charges in their display panels.

According to the thirteenth aspect of the present invention, use of an indium gallium zinc oxide as the oxide semiconductor provides the same advantages as offered by the twelfth aspect of the present invention.

According to the fourteenth aspect of the present invention, the same advantages as offered by the first aspect of the present invention are provided in a driving method of display devices.

BRIEF DESCRIPTION OF THE DRAWINGS

FIG. 13 is a table for describing a potential of each signal in the first embodiment in normal operation and at the time of power shut off.

FIG. 15 is a timing chart for describing an operation of the second embodiment in normal operation and at the time of power shutoff.

FIG. 16 is a timing chart for describing an operation of a third embodiment in normal operation and at the time of power shutoff, according to the present invention.

DESCRIPTION OF THE EMBODIMENTS

Hereinafter, a first through a third embodiments of the present invention will be described with reference to the attached drawings. Each transistor is provided by a field effect transistor, and more specifically by an n-channel TFT. In the following description regarding the n-channel TFT, the gate terminal represents the control terminal, the drain terminal represents the first conduction terminal, and the source terminal represents the second conduction terminal. Also, the description will assume that the TFT is provided by an IGZO-TFT; however, the TFT may be provided by other appropriate oxide TFTs. Examples of other oxide semiconductors than indium gallium zinc oxide which will provide a comparable advantage are those whose channel layer is formed of an oxide semiconductor including at least one of indium, gallium, zinc, copper (Cu), silicon (Si), tin (Sn), aluminum (Al), calcium (Ca), germanium (Ge), and lead (Pb). Note also that m and n each represent an integer not smaller than 2.

1. First Embodiment

1. 1 Overall Configuration

Figure 1:
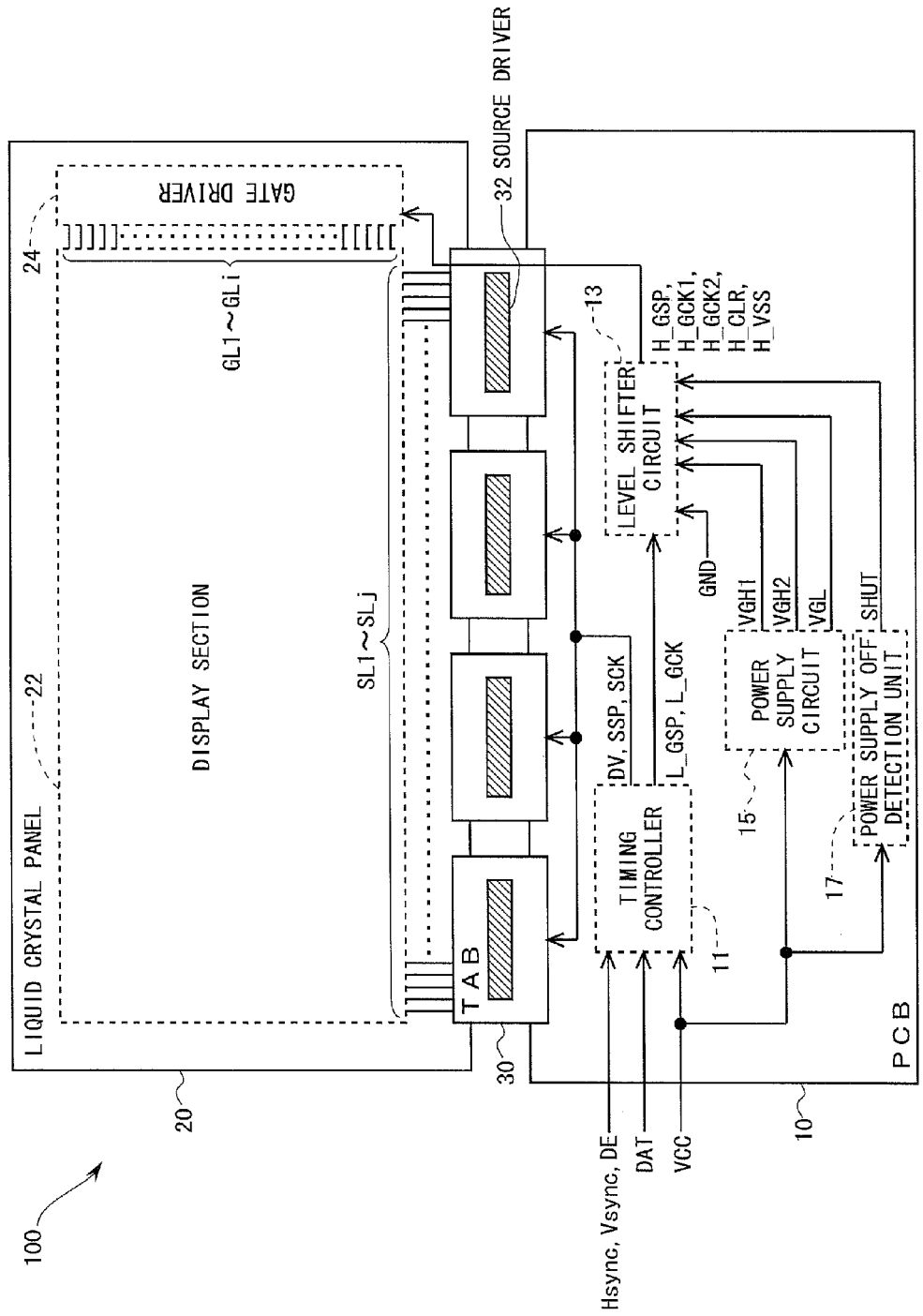
FIG. 1 is a block diagram showing a configuration of a display device according to a first embodiment of the present invention.

FIG. 1 is a block diagram which shows an overall configuration of an active matrix liquid crystal display device 100 according to the present embodiment. The liquid crystal display device 100 includes a printed circuit substrate (PCB) 10, a liquid crystal panel 20 as a display panel, and a tape automated bonding (TAB) tape 30 connected to the PCB 10 and the liquid crystal panel 20. The PCB 10 is provided with a timing controller 11, a level shifter circuit 13, a power supply circuit 15, and a power supply OFF detection unit 17. Further, the PCB 10 is also provided with an unillustrated discharge unit which will be described later, but this will not be covered while reference is made to FIG. 1. The liquid crystal panel 20 is provided by an IGZO-TFT liquid crystal panel. The TAB tape 30 is mounted with a source driver 32 in the form of an IC chip, for driving data lines SL1 through SLm. The TAB tape 30 is a package form of the source driver 32 utilized mainly for middle- to large-size liquid crystal panels. For small- to middle-size liquid crystal panels, chip-on-glass (COG) mounting is utilized as a package form of the source driver 32. Recently, a single chip containing the source driver 32, the timing controller 11, the level shifter circuit 13, the power supply circuit 15 and the power supply OFF detection unit 17 therein is gradually becoming popular.

The liquid crystal display device 100 operates on an external electric power supply. The liquid crystal display device 100 is supplied with, e.g., a +5 volt potential, under a normal power supply. Hereinafter, the potential supplied from the power source to the liquid crystal display device 100 will be called "input power supply potential" and will be indicated by a reference symbol VCC. Once the power supply is shut off, the input power supply potential VCC gradually decreases to a ground potential (0V).

The liquid crystal panel 20 includes a liquid crystal layer, and two substrates (typically glass substrates but are not limited to glass substrates) which sandwich the liquid crystal layer. The substrate is formed, in its predetermined area, with a display section 22 for displaying an image. The display section 22 includes as many as n scanning lines GL1 through GLn, m data lines SL1 through SLm, and m×n pixel formation portions disposed in a matrix pattern correspondingly to intersections made by the n scanning lines GL1 through GLn and the m data lines SL1 through SLm.

Figure 2:
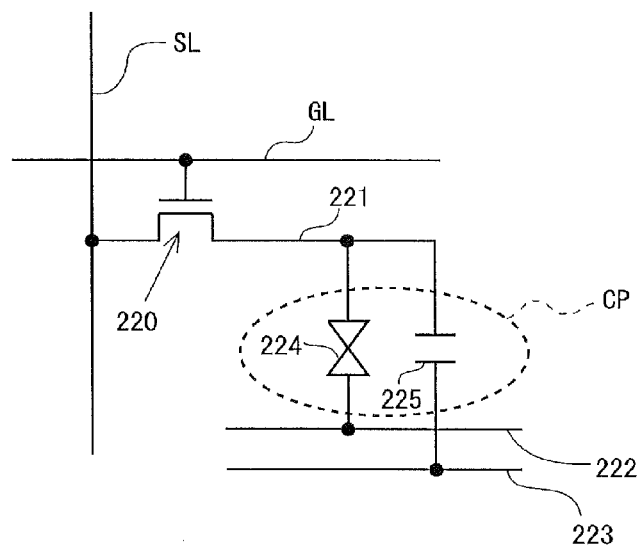
FIG. 2 is a circuit diagram showing a configuration of a pixel formation portion in the first embodiment.

FIG. 2 is a circuit diagram which shows a configuration of the pixel formation portion. Each pixel formation portion includes: a transistor 220 which has its gate terminal connected to one of the scanning lines GL that passes a corresponding one of the intersections, and its source terminal connected to one of the data lines SL that passes the said intersection; a pixel electrode 221 connected to the drain terminal of the transistor 220; a common electrode 222 and an auxiliary capacitance electrode 223 which are common to the m×n pixel formation portions; a liquid crystal capacitance 224 formed by the pixel electrode 221 and the common electrode 222; and an auxiliary capacitance 225 formed by the pixel electrode 221 and the auxiliary capacitance electrode 223. The transistor 220 is provided by an n-channel IGZO-TFT as mentioned above. The liquid crystal capacitance 224 and the auxiliary capacitance 225 form a pixel capacitance CP. When the scanning line GL, which is connected to the gate terminal of the transistor 220, is selected, the transistor 220 assumes an ON state, whereupon a data signal coming through the data line SL is written to the pixel capacitance CP.

As shown in FIG. 1, the liquid crystal panel 20 is further formed with a gate driver 24 for driving the scanning lines GL1 through GLn. The gate driver 24 represents the scanning line drive circuit. The gate driver 24 is provided by an IGZO-GDM, and is formed on the substrate which provides the liquid crystal panel 20, in a monolithic fashion. In FIG. 1, the gate driver 24 is formed only on one side of the display section 22; however, the display section 22 may be formed using both the left and the right sides.

As described, in the present embodiment, the m data lines SL1 through SLm, the n scanning lines GL1 through GLn, the m×n pixel formation portions, and the gate driver 24 are formed on one of the substrates which constitute the liquid crystal panel 20.

The liquid crystal display device 100 is externally supplied with timing signals such as a horizontal synchronization signal Hsync, a vertical synchronization signal Vsync, and a data enable signal DE; an image signal DAT; and an input power supply potential VCC. The input power supply potential VCC is supplied to the timing controller 11, the power supply circuit 15, and the power supply OFF detection unit 17. The input power supply potential VCC in normal operation is +5 volts for example; however, the input power supply potential VCC is not limited to +5 volts. The input signal is not limited to what is described above, either. Note also, that the timing signals and the image signal DAT may alternatively be transferred by using a differential interface such as Low Voltage Differential Signaling (LVDS), Mobile Industry Processor Interface (MIPI), Display Port (DP) or Enbedded Display Port (e-DP).

The power supply circuit 15 generates, based on the input power supply potential VCC, a gate-on potential (scanning line selection potential) VGH which is maintained at a level that brings the scanning lines GL to a selected state in normal operation; and a gate-off potential (scanning line de-selection potential) VGL which is maintained at a level that brings the scanning lines GL to a de-selected state in normal operation. The gate-on potential VGH and the gate-off potential VGL which are generated in the power supply circuit 15 are maintained at constant levels in normal operation, but their levels will change when the external power supply is shut off. In the present embodiment, the power supply circuit 15 generates the gate-on potential VGH in two different potentials (a first and a second gate-on potentials VGH1 and VGH2). Description will later cover how the gate-on potentials VGH are generated in two kinds of forms. In normal operation, the gate-on potential VGH has a predetermined value of +20 volts, whereas the gate-off potential VGL has a predetermined value of −10 volts. The power supply circuit 15 supplies the generated first and second gate-on potentials VGH1, VGH2 and the gate-off potential VGL to the level shifter circuit 13.

The power supply OFF detection unit 17 generates a power supply state signal SHUT which indicates a power supply state (power ON/OFF state), and supplies this signal to the level shifter circuit 13. The power supply state signal SHUT represents the power-off signal. The power supply OFF detection unit 17 represents the power supply state detection unit.

The timing controller 11 receives the timing signals such as the horizontal synchronization signal Hsync, the vertical synchronization signal Vsync, and the data enable signal DE; the image signal DAT; and the input power supply potential VCC; and generates a digital image signal DV, a source start pulse signal SSP, a source clock signal SCK, a gate start pulse signal L_GSP, and a gate clock signal L_GCK. The digital image signal DV, the source start pulse signal SSP and the source clock signal SCK are supplied to the source driver 32, whereas the gate start pulse signal L_GSP and the gate clock signal L_GCK are supplied to the level shifter circuit 13. The gate start pulse signal L_GSP and the gate clock signal L_GCK have their HIGH level potential being equal to the input power supply potential VCC, and their LOW level potential being equal to a ground potential GND.

The level shifter circuit 13 utilizes the ground potential GND, the first and the second the gate-on potentials VGH1, VGH2 and the gate-off potential VGL supplied from the power supply circuit 15, to generate: a signal H_GSP which is a signal obtained through a level conversion of the gate start pulse signal L_GSP outputted from the timing controller 11 into a timing signal optimized for IGZO-GDM driving; a first and a second gate clock signals H_GCK1, H_GCK2 based on the gate clock signal L_GCK outputted from the timing controller 11; and a reference potential H_VSS and a clear signal H_CLR based on an internal signal. Hereinafter, the first and the second gate-on potentials VGH1, VGH2 may be collectively called "gate-on potential VGH". The level shifter circuit 13 supplies the generated gate start pulse signal H_GSP, the first and the second gate-on potentials VGH1, VGH2, the clear signal H_CLR, and the reference potential H_VSS, to the gate driver 24. Hereinafter, these signals which are generated in the level shifter circuit 13 and supplied to the gate driver 24 will be called "GDM signals" for convenience. In normal operation, the gate start pulse signal H_GSP, and the first and the second gate clock signals H_GCK1, H_GCK2 have their potentials being equal to the first gate-on potential VGH1 or the gate-off potential VGL; the clear signal H_CLR has its potential being equal to the second gate-on potential VGH2 or the gate-off potential VGL; and the reference potential H_VSS is equal to the gate-off potential VGL. In the present embodiment, the timing controller 11 and the level shifter circuit 13 implement the drive controller.

Figure 3:
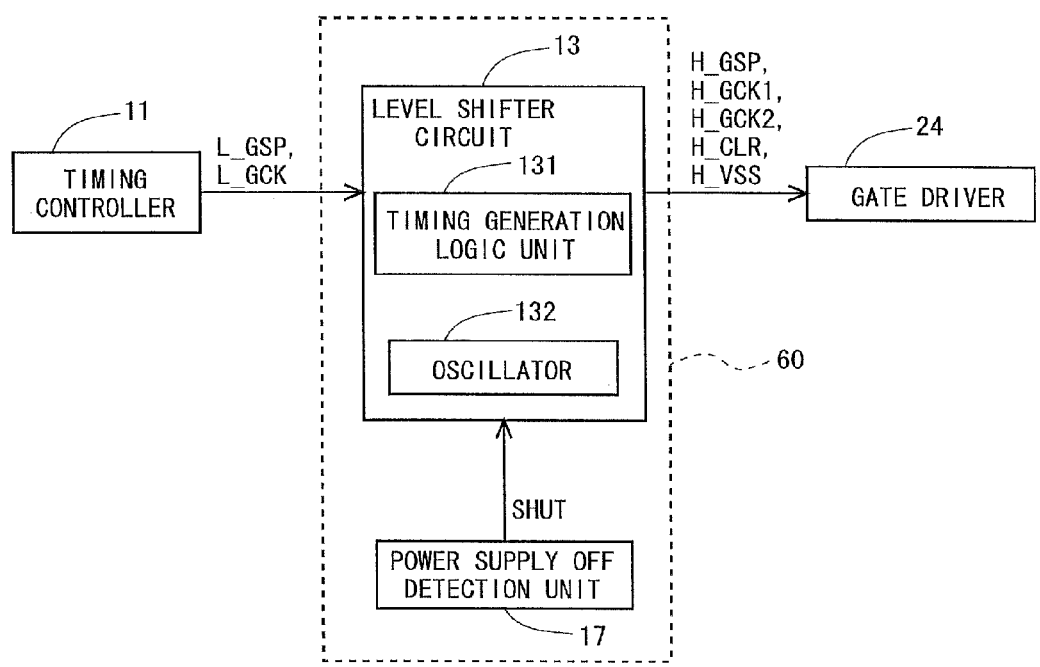
FIG. 3 is a block diagram for describing a configuration of a level shifter circuit shown in FIG. 1.

As shown in FIG. 3, in the present embodiment, the level shifter circuit 13 includes a timing generation logic unit 131 and an oscillator 132, which are supplied with the power supply state signal SHUT outputted from the power supply OFF detection unit 17. With the arrangement described as the above, the level shifter circuit 13 is capable of changing the potentials of the GDM signals at predetermined timings (from Time Point t1 through t3 in FIG. 12 which will be described later). The predetermined timing may be given by signal generation based on, for example, a non-volatile memory in the IC which constitutes the level shifter circuit 13, and a register value loaded from data stored in the non-volatile memory. The level shifter circuit 13 will be described later in more detail.

The source driver 32 receives the digital image signal DV, the source start pulse signal SSP, and the source clock signal SCK outputted from the timing controller 11, and applies data signals to the data lines SL1 through SLm.

The gate driver 24 repeats application of an active scanning signal to the scanning lines GL1 through GLn using one vertical scanning period as a cycle, based on the gate start pulse signal H_GSP, the first and the second gate clock signals H_GCK1, H_GCK2, the clear signal H_CLR, and the reference potential H_VSS outputted from the level shifter circuit 13. The gate driver 24 will be described later in more detail.

As the data signals are applied to the data lines SL1 through SLm, and the scanning signals are applied to the scanning lines GL1 through GLn as described above, an image based on the externally supplied image signal DAT is displayed in the display section 22.

1.2 Two Kinds of Gate-on Potentials

Figure 4:
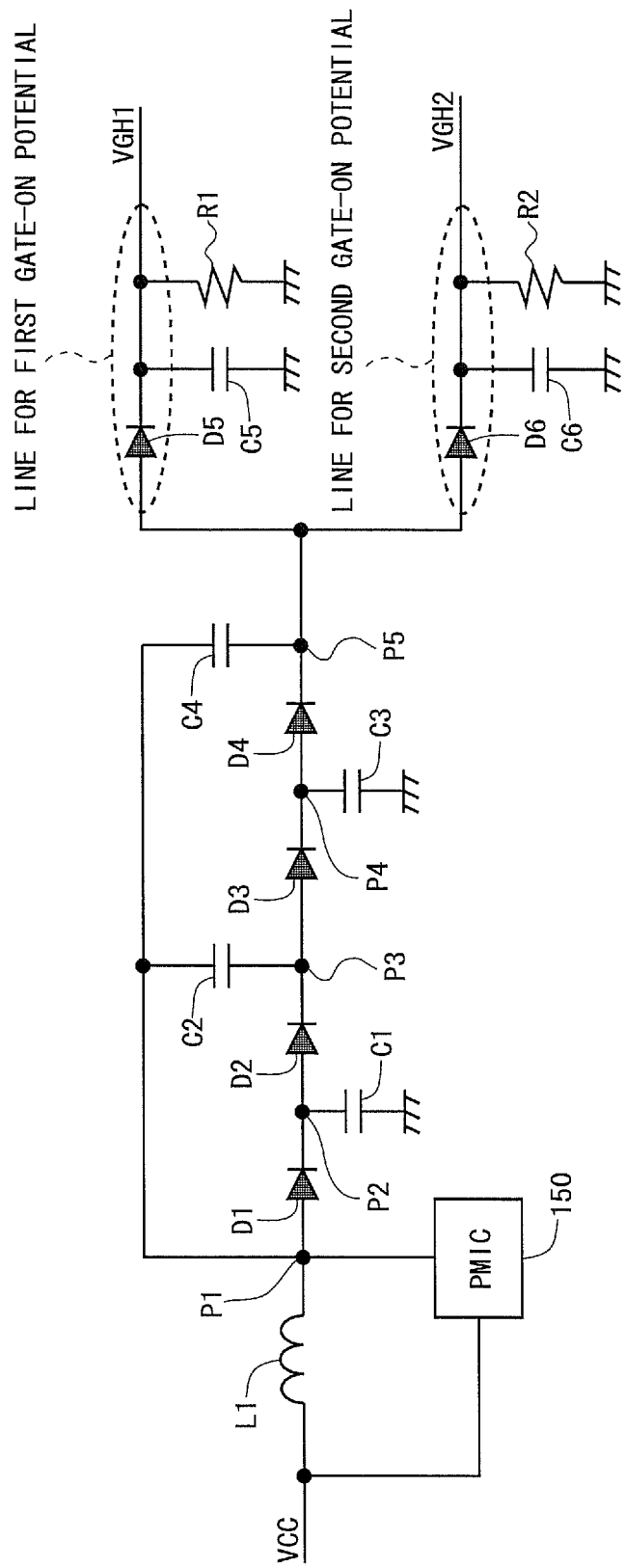
FIG. 4 is a circuit diagram showing an example of a circuit configuration relating to generation of a first and a second gate-on potentials, in a power supply configuration shown in FIG. 1.

FIG. 4 is a circuit diagram showing an example of a circuit configuration relating to generation of the first and the second gate-on potentials VGH1, VGH2, in the power supply circuit 15. It should be noted here that voltage values used in the following description are only for examples, and are not limiting at all. The power supply circuit 15 includes a power supply management integrated circuit (PMIC) 150, a coil L1, six diodes D1 through D6, six capacitors (capacitances) C1 through C6, and two resistors R1, R2, as elements for generating two kinds of gate-on potentials VGH. It should be noted here that a forward voltage drop in the diodes D1 through D6 will be indicated as "Vf".

In the power supply circuit 15, first, a 5 volt amplitude signal generated by using the PMIC 150 appears at a node P1. At a node P2, a (5-Vf) volt voltage appears due to a smoothing performed by using the diode D1 and the capacitor C1. At a node P3, a signal having a value of (5-2Vf) volts through (10-2Vf) volts appears due to a coupling by the capacitor C2 and a forward voltage drop at the diode D2. Likewise, a voltage of (10-3Vf) volts appears at a node P4, and a voltage of (10-4Vf) volts through (15-4Vf) volts appears at a node P5.

As shown in FIG. 4, a power supply wire is split into a line for the first gate-on potential VGH1 and a line for the second gate-on potential VGH2 at a point which is closer to output than the node P5 is. In the line for the first gate-on potential VGH1, a voltage of (15-5Vf) volts is generated due to smoothing by the diode D5 and the capacitor C5. In the line for the second gate-on potential VGH2, a voltage of (15−5Vf) volts is generated due to smoothing by the diode D6 and the capacitor C6. Following the process described above, the first and the second gate-on potentials VGH1, VGH2 are equal to each other in normal operation.

Figure 5:
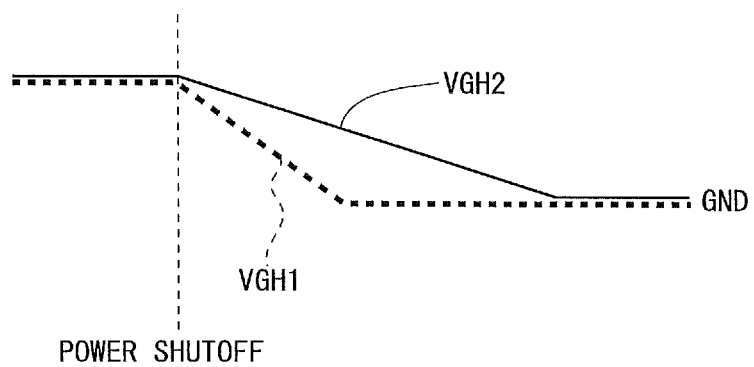
FIG. 5 is a waveform chart for describing how the first and the second gate-on potentials change when power supply is shut off in the first embodiment according to the present invention.

Once the power supply is shut off, the first and the second gate-on potentials VGH1, VGH2 decrease their levels in accordance with constants of the capacitor and the resistor (capacitance value and resistor value) connected to the line for the first gate-on potential VGH1 and the line for the second gate-on potential VGH2. In the present embodiment, the line for the first gate-on potential VGH1 and the line for the second gate-on potential VGH2 are connected to capacitors and resistors having different constants. More specifically, the line for the second gate-on potential VGH2 has a time constant determined by the capacitor C6 and the resistor R2, which is greater than a time constant determined by the capacitor C5 and the resistor R1 for the line for the first gate-on potential VGH1. Thus, when the power supply is shut off, the second gate-on potential VGH2 decreases more slowly than the first gate-on potential VGH1 as shown in FIG. 5. In the present embodiment, the capacitor C5 and the resistor R1 represent the first capacitance and the first resistor respectively, whereas the capacitor C6 and the resistor R2 represent the second capacitance and the second resistor respectively.

1. 3 Discharge Unit

Figure 6:
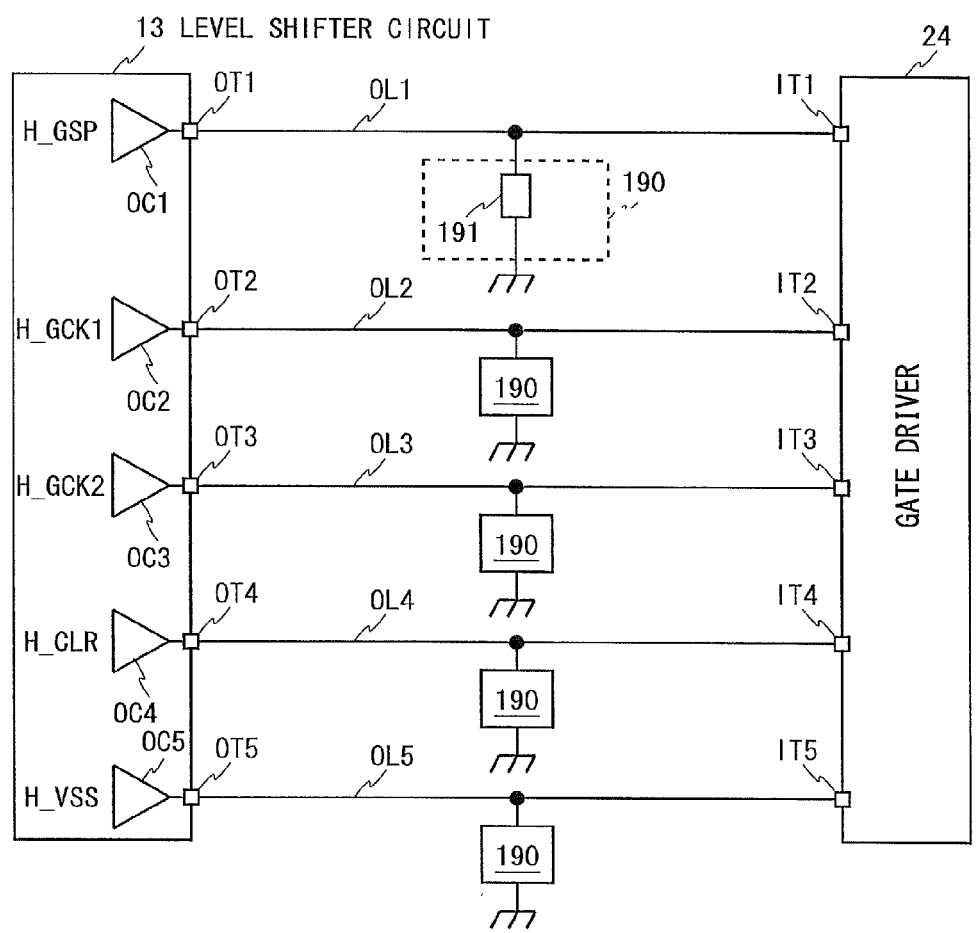
FIG. 6 is a block diagram for describing a configuration of a level shifter circuit and a discharge unit in the first embodiment.

FIG. 6 is a block diagram for describing a configuration of the level shifter circuit 13 and a discharge unit 190 according to the present embodiment. The level shifter circuit 13 includes a first through a fifth output circuits OC1 through OC5; and a first through a fifth output terminals OT1 through OT5 corresponding to the first through the fifth output circuits OC1 through OC5 respectively. The first output circuit OC1 and the first output terminal OT1 are a circuit and a terminal for outputting the gate start pulse signal H_GSP, respectively. The second output circuit OC2 and the second output terminal OT2 are a circuit and a terminal for outputting the first gate clock signal H_GCK1, respectively. The third output circuit OC3 and the third output terminal OT3 are a circuit and a terminal for outputting the second gate clock signal H_GCK2, respectively. The fourth output circuit OC4 and the fourth output terminal OT4 are a circuit and a terminal for outputting the clear signal H_CLR, respectively. The fifth output circuit OC5 and the fifth output terminal OT5 are a circuit and a terminal for outputting the reference potential H_VSS, respectively. Each output circuit OC is connected to its corresponding output terminal OT. It should be noted here that the output terminal OT which is connected to the output circuit OC may be regarded as an output terminal of the output circuit OC; however, the output circuit OC and the output terminal OT will be treated as separate elements for the sake of description. Each output circuit OC operates on the second gate-on potential VGH2 of the first and the second gate-on potentials VGH1, VGH2, as their power source which is the power source that has a slower level decrease when the power supply is shut off. For this reason, each output circuit OC outputs an intended potential if the second gate-on potential VGH2 is not lower than a lower operation limit value (predetermined value), but if the second gate-on potential VGH2 is lower than the lower operation limit value, its output assumes a high-impedance state (may also described as the "output terminal OT assumes a high-impedance state").

The gate driver 24 includes a first through a fifth input terminals IT1 through IT5. The first input terminal IT1 is for inputting the gate start pulse signal H_GSP. The second input terminal IT2 is for inputting the first gate clock signal H_GCK1. The third input terminal IT3 is for inputting the second gate clock signal H_GCK2. The fourth input terminal IT4 is for inputting the clear signal H_CLR. The fifth input terminal IT5 is for inputting the reference potential H_VSS.

The level shifter circuit 13 and the gate driver 24 are connected to each other via a first through a fifth wires OL1 through OL5. More specifically, the level shifter circuit 13 and the gate driver 24 are in the following connection relationship: The first output terminal OT1 and the first input terminal IT1 are connected to each other via the first wire OL1. The second output terminal OT2 and the second input terminal IT2 are connected to each other via the second wire OL2. The third output terminal OT3 and the third input terminal IT3 are connected to each other via the third wire OL3. The fourth output terminal OT4 and the fourth input terminal IT4 are connected to each other via the fourth wire OL4. The fifth output terminal OT5 and the fifth input terminal IT5 are connected to each other via the fifth wire OL5.

Each wire OL is connected to a discharge unit 190. The discharge unit 190 has one terminal connected to the wire OL, and another terminal grounded. More specifically, the discharge unit 190 in the present embodiment is provided by a discharge resistor 191 which has one terminal connected to the wire OL, and the other terminal grounded. The discharge resistor 191 has a relatively large resistor value (not smaller than 3 kilo ohms for example), but the value is not limiting at all. The present invention is not limited, either, by the arrangement in the present embodiment described above, that the discharge unit 190 is in the PCB 10. The discharge unit 190 may be in the liquid crystal panel 20 for example.

1. 4 Gate Driver

Figure 7:
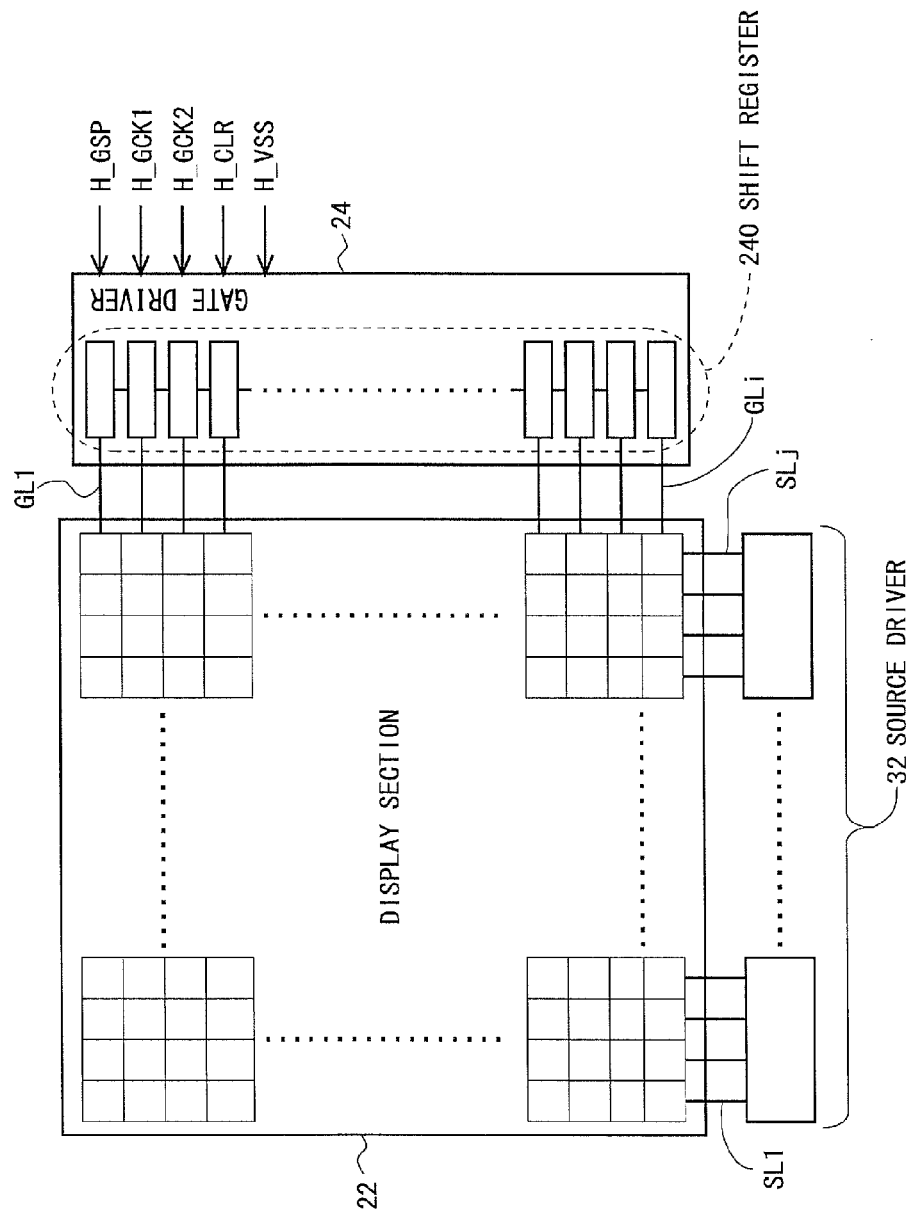
FIG. 7 is a block diagram for describing a configuration of a gate driver shown in FIG. 1.

FIG. 7 is a block diagram for describing a configuration of the gate driver 24 in FIG. 1. The figure does not show the first through the fifth input terminals IT1 through IT5 for convenience. The gate driver 24 includes a shift register 240 which has a plurality of stages. Since the display section 22 is formed with a matrix of n rows times m columns of pixels, the stages are made in one-to-one correspondence to the respective rows, i.e., there are the first through the n-th stages of SR1 through SRn. Note, however, that the shift register 240 may include dummy stages which are not related to any of the rows in the pixel matrix. Each stage SR of the shift register 240 works as a bistable circuit, taking one of the two states at each Time Point and outputs a signal indicating this state (hereinafter called "state signal"). The state signal outputted from each stage SR of the shift register 240 is supplied to a corresponding one of scanning lines GL, as a scanning signal. Hereinafter, the term "stage" and the term "bistable circuit" in the shift register 240 will be used interchangeably to each other, so the bistable circuit may be indicated by a reference symbol SR.

Figure 8:
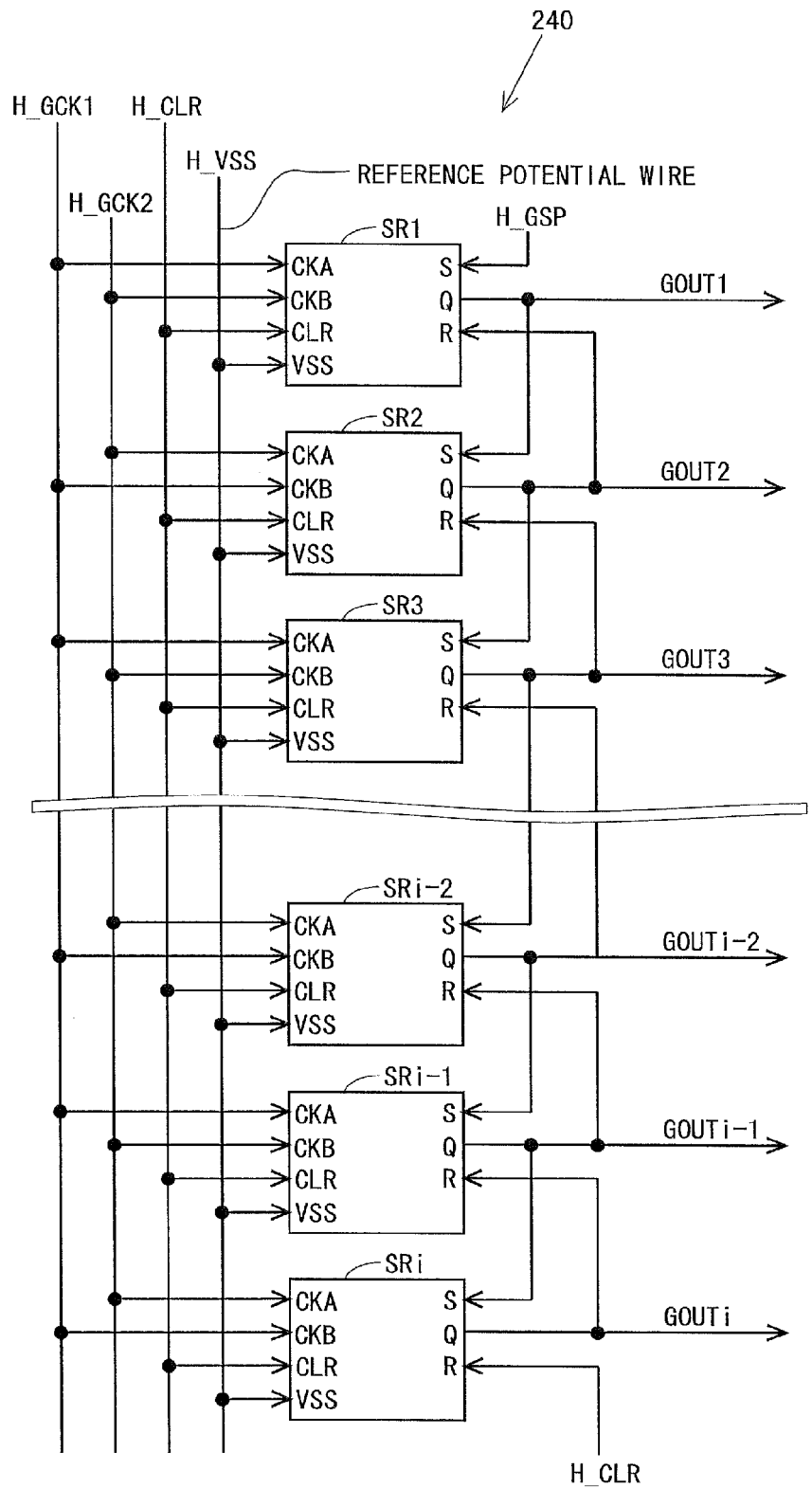
FIG. 8 is a block diagram showing a configuration of a shift register shown in FIG. 7.

FIG. 8 is a block diagram showing a configuration of the shift register 240 shown in FIG. 7. Each bistable circuit SR includes input terminals for receiving a first and a second clocks CKA, CKB, a clear signal CLR, a reference potential VSS, a set signal S, and a reset signal R; and an output terminal for outputting a state signal Q. Each bistable circuit SR is supplied with the reference potential H_VSS which is outputted from the level shifter circuit 13, as the reference potential VSS, and supplied with the clear signal H_CLR which is outputted from the level shifter circuit 13, as the clear signal CLR. Each bistable circuit SR is also supplied with one of the first and the second gate clock signals H_GCK1 and H_GCK2 outputted from the level shifter circuit 13, as the first clock CKA, and the other of the signals as the second clock CKB. Also, each bistable circuit SR is supplied with a state signal Q which is outputted from the previous stage, as the set signal S; and supplied with a state signal Q which is outputted from the next stage, as the reset signal R. In other words, the i-th stage Sri receives a scanning signal GOUTi−1 which is supplied to the (i−1)th scanning line GLi−1, as its set signal S; and a scanning signal GOUTi+1 which is supplied to the (i+1)th scanning lines GLi+1, as its reset signal R. It should be noted here that the gate start pulse signal H_GSP outputted from the level shifter circuit 13 is supplied to the first stage SR1 of the shift register 240, as the set signal S. Also, the clear signal H_CLR which is outputted from the level shifter circuit 13 is also supplied to the n-th stage SRn of the shift register 240, as the reset signal R.

Figure 9:
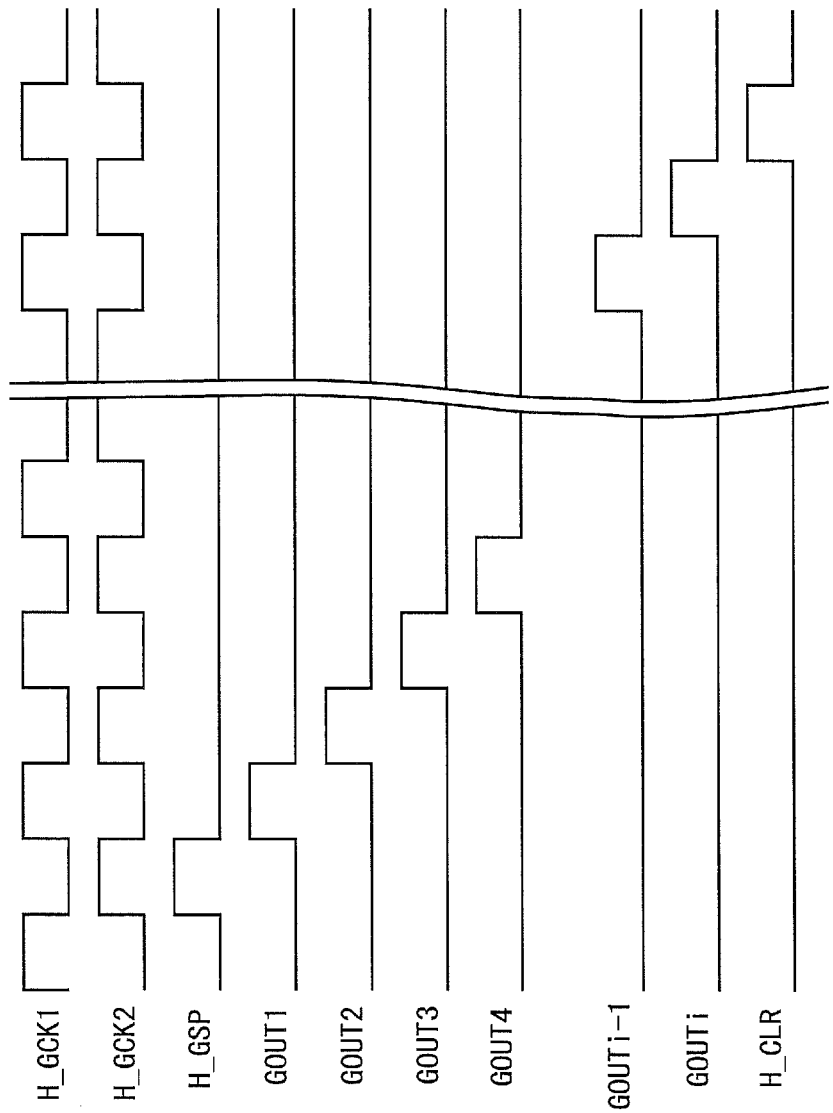
FIG. 9 is a timing chart for describing an operation of the gate driver shown in FIG. 1.

In the arrangement as described above, as the first-stage SR1 of the shift register 240 is supplied with a set signal S which is provided by a pulse of the gate start pulse signal H_GSP, a pulse contained in the gate start pulse signal H_GSP (N.B. this pulse is contained in the state signal Q outputted from each stage) is transferred sequentially from the first-stage SR1 to the n-th stage SRn based on the first and the second gate clock signals H_GCK1 and H_GCK2 (see FIG. 9) which have their on-duty values set at around 50%. As the pulse is transferred, the state signal Q outputted from the 1-st SR1 through the n-th SRn sequentially assumes HIGH level. The state signals Q outputted from the 1-st stage SR1 through the N-th stage SRn are supplied to the scanning lines GL1 through GLn as scanning signals GOUT1 through GOUTn respectively. Hence, as shown in FIG. 9, the scanning signals GOUT1 through GOUTn which sequentially assume HIGH level for a predetermined period are supplied to the scanning lines GL1 through GLn in the display section 22.

In the present embodiment, each stage SR in the shift register 240 has a one-to-one correspondence to one of the rows in the pixel matrix; however, the present invention is not limited to this. For example, in cases where a "double gate driving" is employed as the driving method, a plurality of scanning lines GL are driven simultaneously, and in such a case, one pulse may be used commonly by a plurality of scanning lines GL. In such a case as the above, each stage SR in the shift register 240 is made to correspond to a plurality of rows in the pixel matrix. In other words, number of stages in the shift register 240 and the number of lines in the scanning lines GL may have a ratio of 1 to 1 or 1 to a greater number.

1. 5 Bistable Circuit

Figure 10:
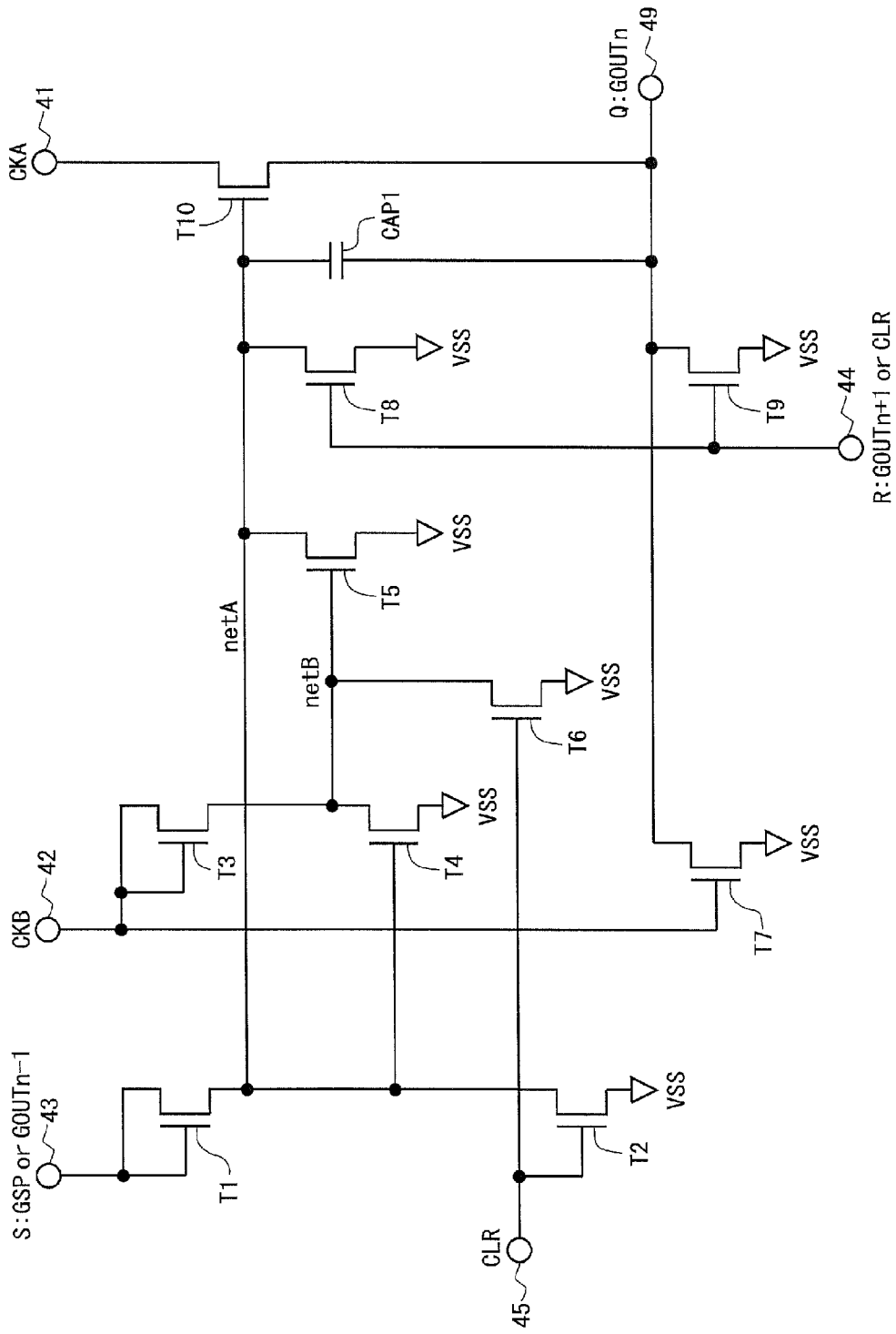
FIG. 10 is a circuit diagram showing a configuration of a bistable circuit shown in FIG. 8.

FIG. 10 is a circuit diagram showing a configuration of a bistable circuit SR shown in FIG. 8. The bistable circuit SR has a first through a tenth transistors (switching elements) T1 through T10, and a capacitor (capacitance) CAP1. The first through the tenth transistors T1 through T10 are provided by n-channel IGZO-TFTs as mentioned earlier. In FIG. 10, the first clock CKA is inputted via an input terminal indicated by a reference symbol 41; the second clock CKB is inputted via an input terminal indicated by a reference symbol 42; the set signal S is inputted via an input terminal indicated by a reference symbol 43; the reset signal R is inputted via an input terminal indicated by a reference symbol 44; the clear signal CLR is inputted via an input terminal indicated by a reference symbol 45; and the state signal Q is inputted via an input terminal indicated by a reference symbol 49.

In the present embodiment, a term "first node" will be used and indicated by a reference symbol netA, to refer to a connection point of the source terminal of the first transistor T1, the drain terminal of the second transistor T2, the drain terminal of the fifth transistor T5, the drain terminal of the eighth transistor T8, the gate terminal of the tenth transistor T10, and one terminal of the capacitor CAP1. Also, a term "second node" will be used and indicated by a reference symbol netB, to refer to a connection point of the source terminal of the third transistor T3, the drain terminal of the fourth transistor T4, the gate terminal of the fifth transistor T5, and the drain terminal of the sixth transistor T6.

The first transistor T1 has its gate terminal and drain terminal connected to the input terminal 43 (In other words, they are diode-connected), and its source terminal connected to the first node netA. The second transistor T2 has its gate terminal connected to the input terminal 45, its drain terminal connected to the first node netA, and its source terminal connected to a reference potential wire (hereinafter, will be indicated by the same reference symbol VSS as of the reference potential). The third transistor T3 has its gate terminal and drain terminal connected to the input terminal 42 (in other words, they are diode-connected), and its source terminal connected to the second node netB. The fourth transistor T4 has its gate terminal connected to the first node netA, its drain terminal connected to the second node netB, and its source terminal connected to the reference potential wire VSS. The fifth transistor T5 has its gate terminal connected to the second node netB, its drain terminal connected to the first node netA, and its drain terminal connected to the reference potential wire VSS. The sixth transistor T6 has its gate terminal connected to the input terminal 45, its drain terminal connected to the second node netB, and its source terminal connected to the reference potential wire VSS. The seventh transistor T7 has its gate terminal connected to the input terminal 42, its drain terminal connected to the output terminal 49, and its source terminal connected to the reference potential wire VSS. The eighth transistor T8 has its gate terminal connected to the input terminal 44, its drain terminal connected to the first node netA, and its source terminal connected to the reference potential wire VSS. The ninth transistor T9 has its gate terminal connected to the input terminal 44, its drain terminal connected to the output terminal 49, and its source terminal connected to the reference potential wire VSS. The tenth transistor T10 has its gate terminal connected to the first node netA, its drain terminal connected to the input terminal 41, and its source terminal connected to the output terminal 49. The capacitor CAP1 has one terminal connected to the first node netA, and the other terminal to the output terminal 49.

In the present embodiment, the output terminal 49 represents the output node. Also, the seventh transistor T7 represents the output node control switching element, the tenth transistor T10 represents the output control switching element, the second transistor T2 represents the first first-node control switching element, the fifth transistor T5 represents the second first-node control switching element, and the sixth transistor T6 represents the second node control switching element.

Figure 11:
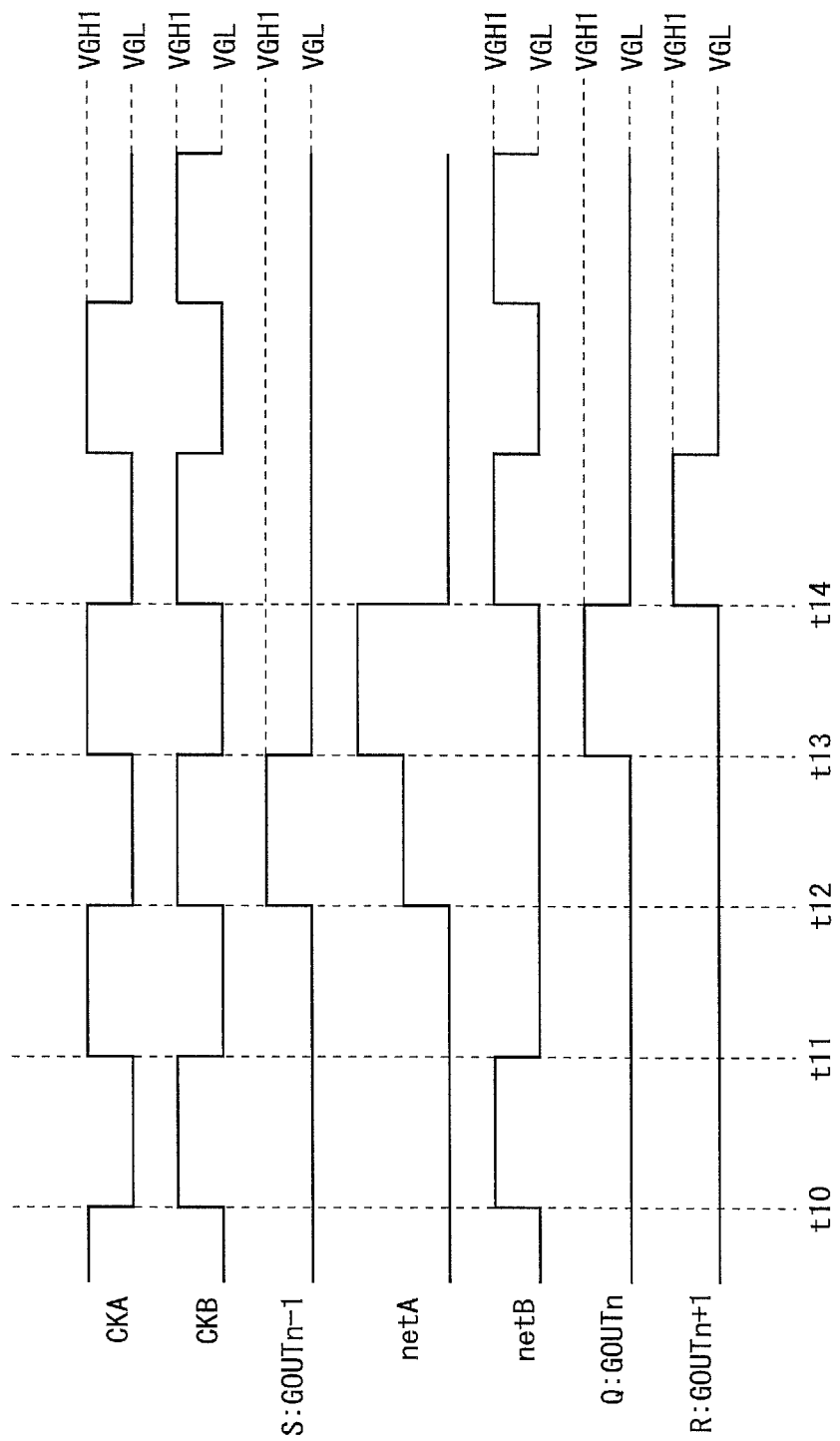
FIG. 11 is a timing chart for describing an operation of the bistable circuit shown in FIG. 8.

FIG. 11 is a timing chart for describing an operation of the bistable circuit SR shown in FIG. 8. During a period in which the liquid crystal display device 100 is in operation, the bistable circuit SR is supplied with the first and the second clocks CKA, CKB which have their on-duty values set at around 50%. The first and the second clocks CKA, CKB have their HIGH level potentials set at the first gate-on potential VGH1, and their LOW level potentials set at the gate-off potential VGL. The clear signal CLR assumes LOW level during the period shown in FIG. 11, so it is not shown in FIG. 11.

When Time Point t10 is reached, the second clock CKB changes from LOW level to HIGH level. The third transistor T3, which is diode-connected as shown in FIG. 10, turns ON. At this point, a potential at the first node netA and the clear signal CLR are at LOW level, so the fourth and the sixth transistors T4, T6 are in OFF state. Thus, at Time Point t10, a potential at the second node netB changes from LOW level to HIGH level. As a result, the fifth transistor T5 turns ON, and the potential of the first node netA is drawn into the reference potential VSS. Also at Time Point t10, the seventh transistor T7 turns ON. Therefore, a state signal Q (a potential of the output terminal 49) is drawn into the reference potential VSS.

When Time Point t11 is reached, the first clock CKA changes from LOW level to HIGH level. At this point, the potential of the first node netA is LOW level and the tenth transistor T10 is in OFF state, so the state signal Q is kept at LOW level. Also at Time Point t11, as the second clock CKB changes from HIGH level to LOW level, the potential of the second node netB changes from HIGH level to LOW level.

When Time Point t12 is reached, the set signal S changes from LOW level to HIGH level. The first transistor T1, which is diode-connected as shown in FIG. 10, turns ON. Therefore, the capacitor CAP1 is charged, and the potential of the first node netA changes from LOW level to HIGH level. This turns ON the tenth transistor T10. During the period from Time Point t12 through t13, the first clock CKA assumes LOW level. Therefore, the state signal Q is kept at LOW level during this period. Also, during this period, the reset signal R is at LOW level, so the eighth transistor T8 is kept in OFF state, and since the potential of the second node netB is at LOW level, the fifth transistor T5 is kept in OFF state. Hence, the potential of the first node netA do not decrease during this period.

When Time Point t13 is reached, the first clock CKA changes from LOW level to HIGH level. The tenth transistor T10 assumes ON state; therefore, as the potential of the input terminal 41 increases, the potential of the output terminal 49 (potential of the state signal Q) increases. Now, as shown in FIG. 10, the capacitor CAP1 is disposed between the first node netA and the output terminal 49, and therefore as the potential of the output terminal 49 increases, the first node netA is bootstrapped. As a result, a large voltage is applied to the gate terminal of the tenth transistor T10, and the potential of the state signal Q is reliably increased to the HIGH level potential of the first clock CKA, i.e., to the potential level of the first gate-on potential VGH1 (recovering from a level decrease due to a threshold voltage in the tenth transistor T10). This turns the scanning line GL, which is connected to the output terminal 49 of the bistable circuit SR, into selected state. It should be noted here that during the period from Time Points t13 through t14, the second clock CKB assumes LOW level, so the seventh transistor T7 is kept in OFF state, and since the reset signal R is at LOW level, the ninth transistor T9 is kept in OFF state. Hence, the potential of the state signal Q does not decrease during this period. Also, during the period Time Points t13 through t14, the reset signal R is at LOW level, so the eighth transistor T8 is kept in OFF state, and since the potential of the second node netB is at LOW level, the fifth transistor T5 is kept in OFF state. Hence, the potential of the first node netA do not decrease during this period.

When Time Point t14 is reached, the first clock CKA changes from HIGH level to LOW level. Therefore, as the potential of the input terminal 41 decreases, the potential of the output terminal 49 (the potential of the state signal Q) decreases. This also decreases the potential of the first node netA via the capacitor CAP1. Also, at Time Point t14, the second clock CKB changes from LOW level to HIGH level, which turns ON the third and the seventh transistors T3, T7, and the reset signal R changes from LOW level to HIGH level, thereby turning ON the eighth and the ninth transistors T8, T9. Further, the third transistor T3 turns ON, to change the potential of the second node netB from LOW level to HIGH level, thereby turning ON the fifth transistor T5. As described, at Time Point t14, the fifth and the eighth transistors turn ON to bring the potential of the first node netA to LOW level; and the seventh and the ninth transistors T7, T9 turn ON, to bring the state signal Q to LOW level.

The operation as has been described thus far takes place in each bistable circuit SR in the shift register 240, whereby as shown in FIG. 9, scanning signals GOUT1 through GOUTn which sequentially assume HIGH level for a predetermined period are supplied to the scanning lines GL1 through GLn in the display section 22.

1. 6 Operation upon Power Shut Down

Figure 12:
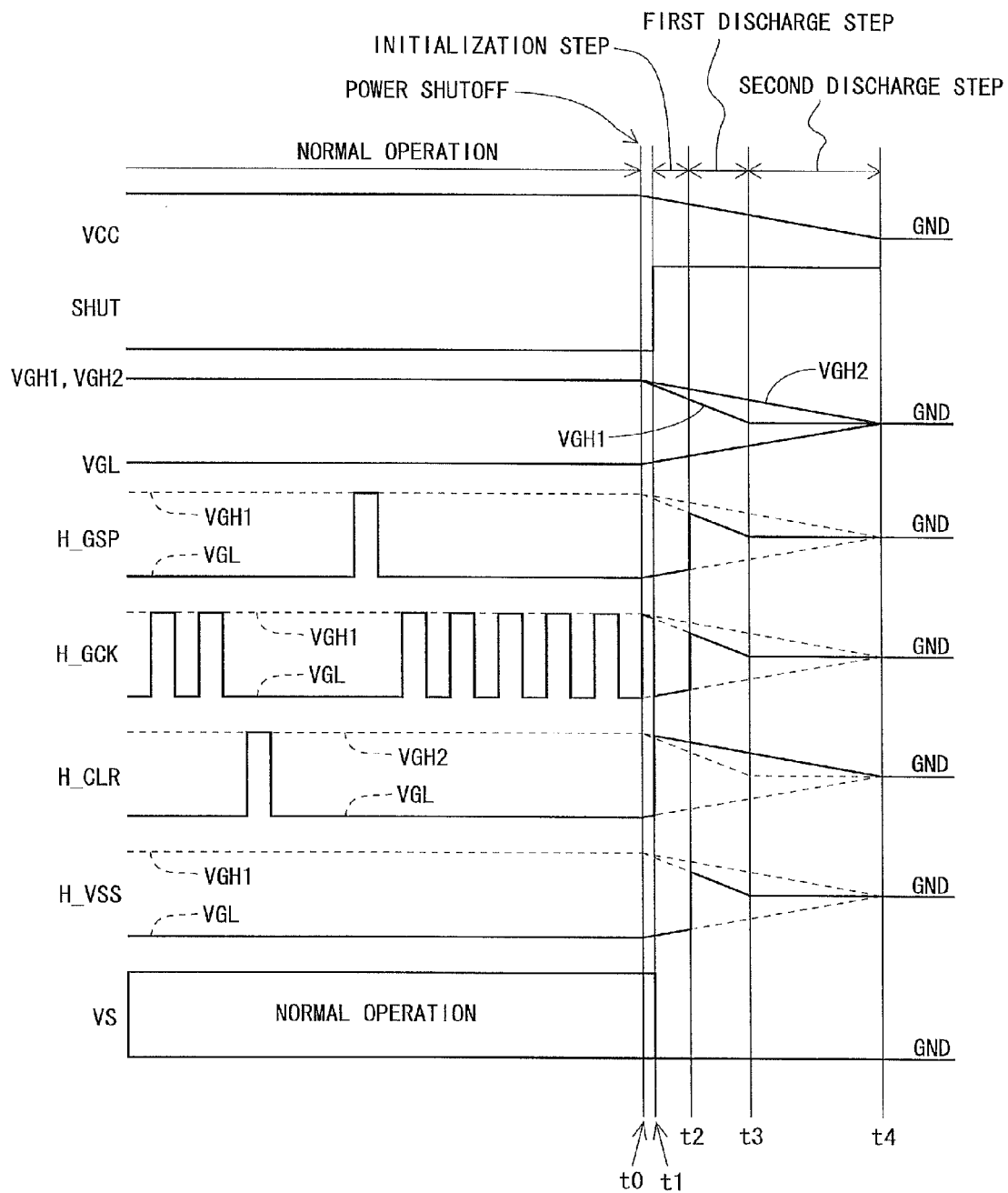
FIG. 12 is a timing chart for describing an operation of the first embodiment when power supply is shut off.

FIG. 12 is a timing chart for describing an operation upon power shut down in the present embodiment. Hereinafter, a series of processes performed when the external power supply is shut off will be called "power-off sequence". FIG. 12 shows waveforms of the input power supply potential VCC, the power supply state signal SHUT, the first and the second gate-on potentials VGH1 and VGH2, the gate-off potential VGL, the gate start pulse signal H_GSP, the gate clock signal H_GCK, the clear signal H_CLR, the reference potential H_VSS, and a data signal potential (a potential of the data line SL) VS. FIG. 13 is a chart for describing signal potentials at the time of normal operation and at the time of power shut down in the present embodiment. The first and the second gate clock signals H_GCK1, H_GCK2 differ from each other in their phases during normal operation, but follow the same waveform change after the power-off which takes place at Time Point t1. For this reason, FIG. 12 shows only one wave form for the first and the second gate clock signals H_GCK1, H_GCK2, as a gate clock signal H_GCK.

As described above, the gate start pulse signal H_GSP is supplied to the first-stage SR1 of the shift register 240, as the set signal S. The gate clock signal H_GCK (the first and the second gate clock signals H_GCK1, H_GCK2) is supplied to each stage SR, as the first and the second clocks CKA, CKB. The clear signal H_CLR is supplied to each stage SR as the clear signal CLR, and also to the n-th stage SRn as the reset signal R. The reference potential H_VSS is supplied to each stage, as the reference potential VSS.

As shown in FIG. 12, the power-off sequence includes an initialization step, a first discharge step, and a second discharge step. The initialization step is a step for resetting (clearing) the state of all the bistable circuits that constitute the shift register 240; the first discharge step is a step for discharging a charge in the pixel formation portion; and the second discharge step is a step for discharging a charge in the gate driver 24. In the following description, it is assumed that there is a normal power supply before Time Point t0, and the power supply is shut off at Time Point t0. Operations relating to the discharge unit 190 and operations when the second gate-on potential VGH2 becomes lower than the lower operation limit value will be described later in detail.

During the period before Time Point t0 when there is a normal supply of power (during normal operation), the power supply state signal SHUT is kept at LOW level. In normal operation, the potential of the gate start pulse signal H_GSP and the potential of the gate clock signal H_GCK are the first gate-on potential VGH1 or the gate-off potential VGL, whereas the potential of the clear signal H_CLR is the second gate-on potential VGH2 or the gate-off potential VGL. In normal operation, the first and the second gate-on potentials VGH1, VGH2 are at the same level (+20 volts for example).

Once the power supply is shut off at Time Point t0, the input power supply potential VCC gradually decrease to the ground potential GND. Because of this, the first and the second gate-on potentials VGH1, VGH2 gradually decrease to the ground potential GND while the gate-off potential VGL gradually increases to the ground potential GND after Time Point t0.

At Time Point t1 which follows the power supply shutoff at Time Point t1, the power supply OFF detection unit 17 changes the power supply state signal SHUT from LOW level to HIGH level. The level shifter circuit 13, upon the change of the power supply state signal SHUT from LOW level to HIGH level, sets only the clear signal H_CLR in the GDM signals to a HIGH level potential while setting the other signals than the clear signal H_CLR to a LOW level potential. In other words, in the period from Time Point t1 to t2, the potential of the clear signal H_CLR is set to the second gate-on potential VGH2, whereas the potential of the gate start pulse signal H_GSP, the potential of the gate clock signal H_GCK, and the potential of the reference potential H_VSS are set to the gate-off potential VGL. As will be understood from FIG. 10, as the clear signal H_CLR assumes HIGH level, the second and the sixth transistors T2, T6 turns ON in each bistable circuit. This brings the potential of the first node netA and the potential of the second node netB to LOW level. Following through the process described above, the initialization step (Time Point t1 through t2) resets (clears) the state in each bistable circuit SR. The data signal potential VS is set to the ground potential GND at Time Point t1 and throughout the periods thereafter.

When Time Point t2 is reached, the level shifter circuit 13 sets all of the signals that constitute the GDM signals to a HIGH level potential. In other words, in the period from Time Point t2 to t3, the potential of the clear signal H_CLR is set to the second gate-on potential VGH2, whereas the potential of the gate start pulse signal H_GSP, the potential of the gate clock signal H_GCK, and the potential of the reference potential H_VSS are set to the first gate-on potential VGH1. At Time Point t2, the first gate-on potential VGH1 has not yet decreased sufficiently. Therefore, the potential of the gate start pulse signal H_GSP, the potential of the gate clock signal H_GCK, and the potential of the reference potential H_VSS are at HIGH level at Time Point t2. In each bistable circuit SR, the seventh transistor T7 turns ON while the reference potential VSS is in HIGH level, and therefore the state signal Q assumes HIGH level. This means that all of the scanning lines GL1 through GLn are now in selected state. Because the data signal potential Vs is at the ground potential GND in the period starting at Time Point t1, a charge stored in the pixel capacitance CP in each pixel formation portion is discharged when all of the scanning lines GL1 through GLn are selected. In the period from Time Point t2 to Time Point t3, the potential of the gate clock signal H_GCK and the reference potential H_VSS gradually decrease to the ground potential GND. This causes gradual decrease in the potential at the output terminal 49 (the potential of the state signal Q) in each bistable circuit SR. In other words, a charge on each scanning lines GL is discharged. Also, the gradual decrease in the potential of the output terminal 49 reduces influence of a kickback voltage on each pixel, i.e., influence on display. Following through the process described above, in the first discharge step (Time Point t2 through t3) charges in all of the pixel formation portions and all of the scanning lines GL1 through GLn in the display section 22 are discharged.

As shown in FIG. 6, the first gate-on potential VGH1 decreases to the ground potential GND more quickly than the second gate-on potential VGH2 once the power supply is shut off. For this reason, the second gate-on potential VGH2 has not decreased sufficiently at Time Point t3, but the first gate-on potential VGH1 has decreased to the ground potential GND. Therefore, the gate start pulse signal H_GSP, the gate clock signal H_GCK, and the reference potential H_VSS which are set to the HIGH level potential at Time Point t2 decrease to the ground potential GND at Time Point t3.

At Time Point t3, the same settings as made in Time Point t2 are made to the clear signal H_CLR, the gate start pulse signal H_GSP, the gate clock signal H_GCK, and the reference potential H_VSS. Since the second gate-on potential VGH2 has not yet decreased sufficiently at Time Point t3 as described above, the clear signal H_CLR is at HIGH level. This turns ON the second and the sixth transistors T2, T6 in each bistable circuit SR, bringing the potential of the first node netA and the potential of the second node netB to LOW level. As a result, in the second discharge step (Time Point t3 through t4), charges at the floating nodes (the first node netA and the second node netB in each bistable circuit) in the shift register 240 which represents a constituent of the gate driver 24 are discharged.

Thereafter, at Time Point t4, the second gate-on potential VGH2 decreases to the ground potential GND. Accordingly, the clear signal H_CLR also decreases to the ground potential GND at Time Point t4, and hereupon the power-off sequence comes to an end.

In the power-off sequence, the potentials of the GDM signals are changed on a plurality of steps as shown in FIG. 12. In order to implement this, the level shifter circuit 13 includes the timing generation logic unit 131 and the oscillator 132 as shown in FIG. 3. When the power supply state signal SHUT, which is supplied from the power supply OFF detection unit 17 to the level shifter circuit 13, changes from LOW level to HIGH level in the configuration described as above, the timing generation logic unit 131 uses its counter to count a base clock which is generated by the oscillator 132, and thereby obtains a start timing for each step. Then, the timing generation logic unit 131 changes potentials of the GDM signals to predetermined levels at each timing provided. Through the process described above, the gate start pulse signal H_GSP, the gate clock signal H_GCK, the clear signal H_CLR and the reference potential H_VSS take respective waveforms as shown in FIG. 12. The level shifter circuit 13 and the power supply OFF detection unit 17 may be incorporated in one LSI 60.

Next, description will cover an operation in the case where the second gate-on potential VGH2 becomes lower than the lower operation limit value. First, consideration will be made for a case where the wire OL is not connected to the discharge unit 190. When the second gate-on potential VGH2 becomes lower than lower operation limit value in the power-off sequence, each output terminal OT in the level shifter circuit 13 assumes a high-impedance state as mentioned earlier. If the wire OL is not connected to the discharge unit 190, the wire OL assume floating state. This makes the wire OL susceptible to noise, which can disturb the GDM signals, making it impossible to obtain the waveforms as shown in FIG. 12. Also, since the wire OL continues to be in floating state after the power-off sequence, the wire OL is still susceptible to noise. As understood, the wire OL assuming floating state can be a cause of malfunction during the power-off sequence and after the power-off sequence.

In the present invention, each wire OL is connected to the discharge unit 190, so that the wires OL do not assume floating state even if the output terminals OT of the level shifter circuit 13 are brought into high-impedance state. Specifically, when the output terminals OT in the level shifter circuit 13 are brought into high-impedance state, the potential of each wire OL is drawn to the ground potential GND via the discharge units 190 (discharge resistors 191). This reduces noise influence onto the wires OL, and makes it possible to obtain the waveforms of the GDM signals as shown in FIG. 12 during the power-off sequence. Also, after the power-off sequence, noise influence onto the wires OL is reduced since the potentials of the wires OL are fixed to the ground potential GND. As described, it is possible to prevent malfunctions during the power-off sequence and after the power-off sequence.

In the initialization step, the clear signal H_CLR is set to HIGH level; in the first discharge step, all signals which constitute the GDM signals are set to HIGH level; and in the second discharge step, the clear signal H_CLR is set to HIGH level. In such an arrangement as this, the discharge resistor 191 is of a relatively large resistor value (e.g., not lower than 3 kΩ) as described above so as to reduce the current which flows through the discharge resistor 191, whereby it is possible to reduce signal level decrease caused by the discharge resistor 191. However, the resistor value of the discharge resistor 191 must be a value which is capable of changing the potentials of the first through the third wires OL1 through OL3, and of the fifth wire OL5 so that they assume the ground potential GND after Time Point t3; and changing the potential of the fourth wire OL4 so that it assumes the ground potential GND after Time Point t4.

In the present embodiment, the power-off sequence represents the in-panel discharge step, whereas the process in the power-off sequence that each wire OL is drawn to the ground potential GND by the discharge unit 190 represents the wire discharge step.

1. 7 Advantages

According to the present embodiment, in the liquid crystal display device 100 which includes an IGZO-GDM, a power-off sequence is performed when power supply is shut off. The power-off sequence includes the first discharge step, in which only the clear signal H_CLR of the GDM signals is set to a LOW level potential. In other words, the gate start pulse signal H_GSP, the gate clock signal H_GCK and the reference potential H_VSS assume HIGH level in the first discharge step. This causes the seventh transistor T7 to turn ON while the reference potential VSS is in HIGH level in each bistable circuit SR, which brings the state signal Q to HIGH level, bringing each scanning line GL into selected state. Since the data signal potential VS is at the ground potential GND in this process, a charge stored in the pixel capacitance CP in each pixel formation portion is discharged. Since the first gate-on potential VGH1 is quicker in its level change (level decrease) than the second gate-on potential VGH2 when the power supply is shut off, charges on the scanning lines GL are also discharged in the first discharge step. Since the second gate-on potential VGH2 is slower in its level change (level decrease) than the first gate-on potential VGH1 when the power supply is shut off, the second gate-on potential VGH2 stays at a level which turns ON the transistors included in each bistable circuit SR, at a time point when the second discharge step is started. Therefore, charges at the floating nodes in each bistable circuit SR are discharged in the second discharge step. Each wire OL which connects the gate driver 24 and the level shifter circuit 13 to each other is connected to the discharge unit 190. Therefore, even if the second gate-on potential VGH2 becomes lower than a lower operation limit value, thereby bringing each output terminal OT in the level shifter circuit 13 into high-impedance state, the wire OL is not brought into floating state. This reduces influence of noise onto each wire OL. As described above, according to the present embodiment, it is possible to remove residual charges in the liquid crystal panel 20 quickly and stably when power is shut off. The liquid crystal display device 100 which includes an IGZO-GDM can enjoy the advantages offered by the present embodiment, of suppressing malfunctions caused by residual charges in the liquid crystal panel 20 since the device was susceptible to malfunctions caused by residual charges in the liquid crystal panel 20.

According to the present embodiment, the fifth and the sixth transistors T5, T6 make it possible to draw the potential of the first node netA into the reference potential VSS any time in normal operation. This also suppresses malfunctions.

According to the present embodiment, the seventh transistor T7 makes it possible to reliably bring each scanning line GL into selected state thereby allowing a charge in each pixel formation portion to be discharged in the first discharge step.

According to the present embodiment, the potential of the output terminal 49 decreases gradually in the first discharge step. This decreases influence of a kickback voltage on each pixel, i.e., influence on display.

According to the present embodiment, the first gate-on potential VGH1 and the second gate-on potential VGH2 use specific wires respectively assigned thereto. This makes it possible to generate two kinds of the gate-on potential VGH which are different from each other in their state of level change when the power supply is shut off, with a relatively simple configuration.

According to the present embodiment, each bistable circuit SR in the shift register 240 is initialized prior to the first discharge step in the power-off sequence. This removes residual charges from inside the liquid crystal panel 20 more reliably when the power supply is shut off, making it possible to effectively suppressing malfunctions caused by residual charges inside the liquid crystal panel 20.

Also, according to the present embodiment, the potential of gate clock signal H_GCK is set to the gate-off potential VGL in the initialization step. Because of this, each bistable circuit SR in the shift register 240 is initialized more reliably in the initialization step.

2. Second Embodiment 2. 1 Discharge Unit

Figure 14:
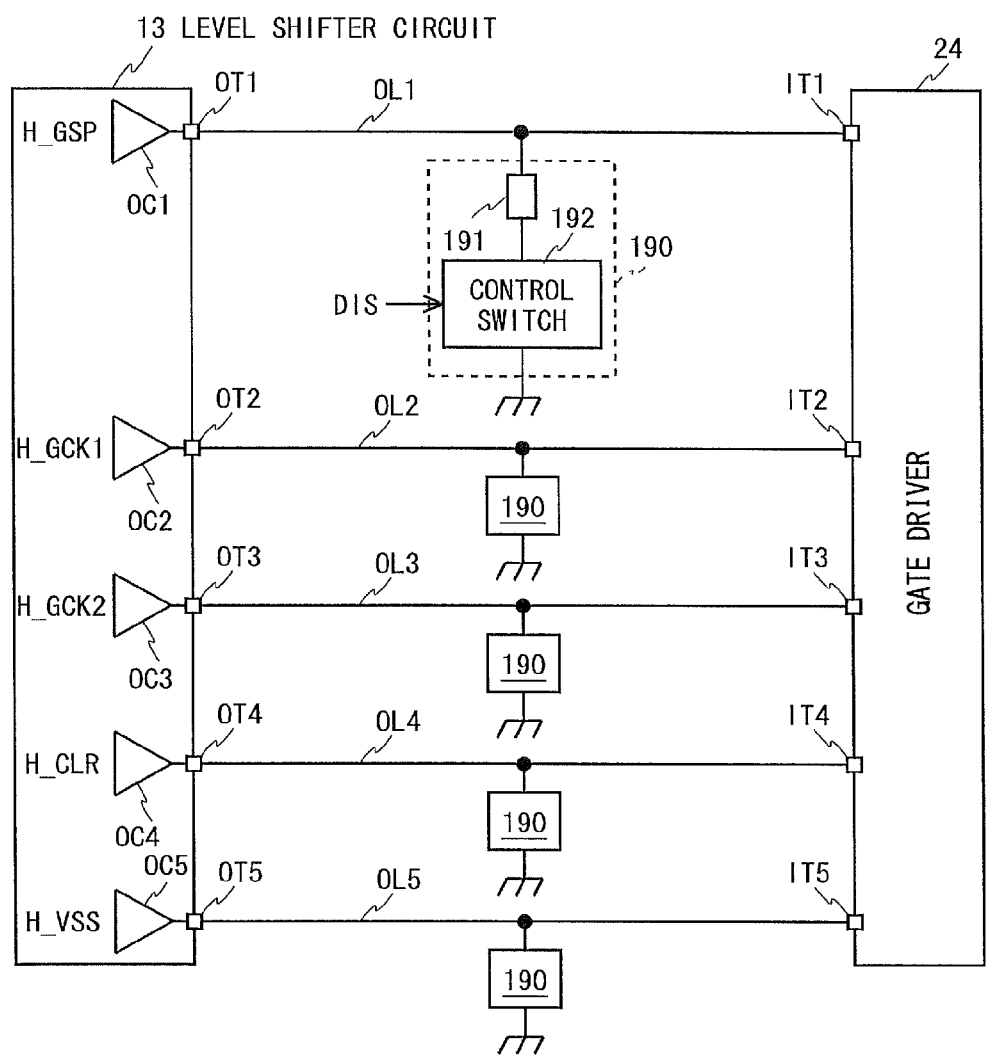
FIG. 14 is a block diagram for describing a configuration of a discharge unit in a second embodiment according to the present invention.

FIG. 14 is a block diagram for describing a configuration of a discharge unit 190 in a second embodiment according to the present invention. Constituent elements of the present embodiment which are identical with those in the first embodiment will be indicated by the same reference symbols, without repeating description thereof when appropriate. In the present embodiment, the discharge unit 190 includes a control switch 192 in series with the discharge resistor 191, in addition to the discharge resistor 191. In the present embodiment, the control switch 192 is between the discharge resistor 191 and a grounding line (see FIG. 14); however, it may be between the discharge resistor 191 and the wire OL. The control switch 192 is controlled based on a control signal DIS. The control signal DIS is generated by the level shifter circuit 13 for example. The control switch 192 opens when the control signal DIS is at HIGH level, i.e., the switch electrically separates the discharge resistor 191 from the grounding line when the control signal DIS is at HIGH level. The control switch 192 closes when the control signal DIS is at LOW level, i.e., the switch electrically connects the discharge resistor 191 and the grounding line to each other when the control signal DIS is at LOW level.

2. 2 Normal Operation and Operation Upon Power Shut Down

FIG. 15 is a timing chart for describing a normal operation and an operation upon power shut down in the present embodiment. As shown in FIG. 15, the control signal DIS assumes HIGH level in normal operation and LOW level at the time of power shut down. Since each control switch 192 is open in normal operation there is no current flowing from the wire OL through the discharge resistor 191. On the other hand, at the time of power shut down, each control switch 192 is closed and therefore the GDM signals are drawn into the ground potential GND as in the first embodiment.

2. 3 Advantages

According to the present embodiment, the control switch 192 which opens in normal operation and closes at the time of power shut down makes it possible to suppress increase in power consumption caused by the discharge resistor 191 during normal operation.

3. Third Embodiment

3. 1 Normal Operation and Operation Upon Power Shut Down

FIG. 16 is a timing chart for describing a normal operation and an operation upon power shut down in the present embodiment. Constituent elements of the present embodiment which are identical with those in the first and second embodiments will be indicated by the same reference symbols, without repeating description thereof when appropriate. In the present embodiment, the discharge unit 190 is identical with the one in the second embodiment in its configuration. Referring to FIG. 16, assume that the second gate-on potential VGH2 is lower than the lower operation limit value at Time Point t3a. In the present embodiment, the control signal DIS assumes HIGH level when the second gate-on potential VGH2 is not lower than the lower operation limit value, while assuming LOW level when the second gate-on potential VGH2 is lower than the lower operation limit value. Thus, when the second gate-on potential VGH2 is not lower than the lower operation limit value (during normal operation, and during, e.g., a first half of the power-off sequence), each control switch 192 is open, to prevent electric current from flowing from the wire OL through the discharge resistor 191. On the other hand, when the second gate-on potential VGH2 is lower than the lower operation limit value (e.g., during the last half of the power-off sequence, and after the power-off sequence), each control switch 192 is closed and therefore the GDM signals are drawn into the ground potential GND like in the first embodiment.

3. 2 Advantages

According to the present embodiment, the control switch 192 is open in normal operation like in the second embodiment, and therefore there is no electric current flowing through the discharge resistor 191. Hence, it is possible to suppress increase in power consumption caused by the discharge resistor 191 during normal operation. At the time of power shut down, the control switch 192 is open until the second gate-on potential VGH2 becomes lower than the lower operation limit value, so no electric current flows through the discharge resistor 191. This stabilizes output waveforms from the level shifter circuit 13 until the second gate-on potential VGH2 becomes lower than the lower operation limit value, and therefore makes it possible to remove residual charge from inside the liquid crystal panel 20 even more stably when power is shut off. Also, the third embodiment provides greater suppression than the second embodiment on power consumption increase caused by the discharge resistor 191 at the time of power shut down (e.g., a first half of the power-off sequence).

4. Others

The present invention is not limited to the embodiments described thus far, but may be varied in many ways within the spirit of the present invention. For example, in the first discharge step in each embodiment, the clear signal H_CLR may be set to LOW level (the gate-off potential VGL). Also, the output circuit OC may be designed to operate on the first gate-on potential VGH1 as a power supply, rather than on the second gate-on potential VGH2. In this case, the control signal DIS in the third embodiment assumes HIGH level when the first gate-on potential VGH1 is not lower than the lower operation limit value, while assuming LOW level when the first gate-on potential VGH1 is lower than the lower operation limit value. Also, there may be an arrangement where part of the first through the fifth output circuit OC1 through OC5 operates on the second gate-on potential VGH2 as a power supply, while the rest of the first through the fifth output circuit OC1 through OC5 operates on the first gate-on potential VGH1 as a power supply. The liquid crystal panel 20 may use p-channel TFTs instead of n-channel TFTs. Further, the present invention is applicable not only to liquid crystal display devices but also other display devices which include pixel formation portions that holds charges.

INDUSTRIAL APPLICABILITY

The present invention is intended for active matrix display devices, and is particularly applicable to, e.g., a liquid crystal display device which includes a monolithic gate driver utilizing a TFF which has its channel layer formed of an oxide semiconductor.

LEGENDS

11 Timing Controller
13 Level Shifter Circuit

15 Power Supply Circuit
17 Power supply OFF detection Unit
20 Liquid Crystal Panel
22 Display Section
24 Gate Driver (Scanning Line Drive Circuit)
32 Source Driver (Data Line Drive Circuit)
100 Liquid Crystal Display Device (Display Device)
190 Discharge Unit
191 Discharge Resistor
192 Control Switch
220 Transistor
240 Shift Registers
OC Output Circuit
OL Wire
OT Output Terminal
VCC Input Power Supply Potential
SHUT Power Supply State Signal
VGH Gate-On Potential
VGH1 First Gate-On Potential
VGH2 Second Gate-On Potential
VGL Gate-Off Potential
L_GCK Gate Clock Signal
H_GCK1 First Gate Clock Signal
H_GCK2 Second Gate Clock Signal
L_GSP, H_GSP Gate Start Pulse Signals
L_CLR, H_CLR, CLR Clear Signals
L_VSS, H_VSS, VSS Reference Potentials
DIS Control Signal
T1-T10 Transistors
CKA First Clock
CKB Second Clock
S Set Signal
R Reset Signal
Q State Signal
GOUT Scanning Signal

The invention claimed is:

1. A display device comprising:
a display panel including a plurality of data lines for delivery of data signals, a plurality of scanning lines, a plurality of pixel formation portions corresponding to the plurality of data lines and the plurality of scanning lines, and a scanning line drive circuit configured to selectively drive the plurality of scanning lines;
a drive controller configured to control the scanning line drive circuit;
a power supply circuit configured to generate and supply to the drive controller, a scanning line selection potential for bringing the scanning lines into a selected state and a scanning line de-selection potential for bringing the scanning lines into a de-selected state, based on an external electric power supply;
a plurality of wires for connecting the scanning line drive circuit and the drive controller to each other;
a discharge unit having one terminal connected to the wire, and another terminal grounded; and
a power supply state detection unit configured to supply a predetermined power-off signal to the drive controller upon detection of an OFF state of the power supply; wherein
the scanning line drive circuit includes a shift register having a plurality of bistable circuits corresponding to the scanning lines and configured to sequentially output a pulse based on a clock signal,
the power supply circuit generates, as the scanning line selection potential, a first scanning line selection potential and a second scanning line selection potential, the second scanning line selection potential being slower in its level change than the first scanning line selection potential when the power supply is brought to an OFF state,
the drive controller
supplies the scanning line drive circuit with the clock signal, a clear signal for initializing a state of the bistable circuits, and a reference potential as a baseline for operation of the bistable circuits, respectively via the wires, and
sequentially performs, upon reception of the power-off signal, a first discharge process of setting a potential of the clock signal and the reference potential to the first scanning line selection potential, and a second discharge process of setting a potential of the clear signal to the second scanning line selection potential, and
the bistable circuit includes:
an output node connected to a corresponding one of the scanning lines;
an output control switching element having its first conduction terminal supplied with the clock signal, and its second conduction terminal connected to the output node;
a first node connected to a control terminal of the output control switching element; and
a first first-node control switching element having its control terminal supplied with the clear signal, its first conduction terminal connected to the first node, and its second conduction terminal supplied with the reference potential.

2. The display device according to claim 1, wherein the discharge unit includes a discharge resistor.

3. The display device according to claim 2, wherein the discharge unit further includes a control switch which is in series with the discharge resistor and closes when the power supply is in the OFF state.

4. The display device according to claim 2, wherein the discharge unit further includes a control switch which is in series with the discharge resistor and closes when the second scanning line selection potential becomes lower than a predetermined value.

5. The display device according to claim 1, wherein the drive controller includes a plurality of output circuits configured to operate on the second scanning line selection potential as a power supply and to respectively output the clock signal, the clear signal, and the reference potential.

6. The display device according to claim 1, wherein
the bistable circuit further includes:
a second first-node control switching element having its first conduction terminal connected to the first node, and its second conduction terminal supplied with the reference potential;
a second node connected to a control terminal of the second first-node control switching element; and
a second node control switching element having its control terminal supplied with the clear signal; its first conduction terminal connected to the second node; and its second conduction terminal supplied with the reference potential.

7. The display device according to claim 1, wherein the bistable circuit further includes an output node control switching element having its control terminal supplied with the clock signal, its first conduction terminal connected to the output node, and its second conduction terminal supplied with the reference potential.

8. The display device according to claim 1, wherein the power supply circuit changes, when the power supply is brought to an OFF state, the first scanning line selection potential from a level at a time point when the power supply is brought to the OFF state, to a ground level over a predetermined period of time.

9. The display device according to claim 8, wherein the power supply circuit includes:
   a first scanning line selection potential generation wire connected to at least a first capacitance and a first resistor, for generation of the first scanning line selection potential based on a predetermined potential obtained from the power supply; and
   a second scanning line selection potential generation wire connected to at least a second capacitance and a second resistor, for generation of the second scanning line selection potential based on a predetermined potential obtained from the power supply;
   the second capacitance and the second resistor providing a time constant which is larger than a time constant provided by the first capacitance and the first resistor.

10. The display device according to claim 1, wherein the drive controller performs an initialization process of setting a potential of the clear signal to the second scanning line selection potential and the reference potential to the scanning line de-selection potential, prior to the first discharge process upon reception of the power-off signal.

11. The display device according to claim 10, wherein the drive controller sets a potential of the clock signal to the scanning line de-selection potential in the initialization process.

12. The display device according to claim 1, wherein the switching elements included in the bistable circuit are each provided by a thin film transistor having its channel layer formed of an oxide semiconductor.

13. The display device according to claim 12, wherein the oxide semiconductor is provided by an indium gallium zinc oxide.

14. A driving method for a display device including a display panel including a plurality of data lines for delivery of data signals, a plurality of scanning lines, a plurality of pixel formation portions corresponding to the plurality of data lines and the plurality of scanning lines, and a scanning line drive circuit configured to selectively drive the plurality of scanning lines; a drive controller configured to control the scanning line drive circuit; a power supply circuit configured to generate and supply to the drive controller, a scanning line selection potential for bringing the scanning lines into a selected state and a scanning line de-selection potential for bringing the scanning lines into a de-selected state, based on an external electric power supply; and a plurality of wires for connecting the scanning line drive circuit and the drive controller to each other;
the method comprising:
a power supply state detection step of detecting an ON/OFF state of the electric power supply;
an in-panel discharge step of releasing a charge from inside the display panel upon detection of the OFF state in the power supply state detection step; and
a wire discharge step of releasing a charge stored in the ware, using at least part of a period in which the electric power supply is in the OFF state;
the scanning line drive circuit including a shift register having a plurality of bistable circuits corresponding to the scanning lines and configured to sequentially output a pulse based on a clock signal,
the power supply circuit generating, as the scanning line selection potential, a first scanning line selection potential and a second scanning line selection potential, the second scanning line selection potential being slower in its level change than the first scanning line selection potential when the power supply is brought to an OFF state;
the in-panel discharge step including:
an output step of supplying the scanning line drive circuit with the clock signal, a clear signal for state initialization of the bistable circuits, and a reference potential as an operation baseline for the bistable circuits, via the wires;
a first discharge step of setting a potential of the clock signal and the reference potential to the first scanning line selection potential; and
a second discharge process of setting a potential of the clear signal to the second scanning line selection potential;
the bistable circuit including:
an output node connected to a corresponding one of the scanning lines;
an output control switching element having its first conduction terminal supplied with the clock signal, and its second conduction terminal connected to the output node;
a first node connected to a control terminal of the output control switching element; and
a first first-node control switching element having its control terminal supplied with the clear signal, its first conduction terminal connected to the first node, and its second conduction terminal supplied with the reference potential.

* * * * *